(12) United States Patent
Menon et al.

(10) Patent No.: US 12,050,516 B2
(45) Date of Patent: *Jul. 30, 2024

(54) RELIABILITY CODING WITH REDUCED NETWORK TRAFFIC

(71) Applicant: Microsoft Technology Licensing, LLC, Redmond, WA (US)

(72) Inventors: Jaishankar Menon, Saratoga, CA (US); Pradeep Sindhu, Los Altos Hills, CA (US); Pratapa Reddy Vaka, Saratoga, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/173,838

(22) Filed: Feb. 24, 2023

(65) Prior Publication Data

US 2023/0205632 A1    Jun. 29, 2023

Related U.S. Application Data

(63) Continuation of application No. 17/302,173, filed on Apr. 26, 2021, now Pat. No. 11,630,729.

(60) Provisional application No. 63/016,137, filed on Apr. 27, 2020.

(51) Int. Cl.
| | |
|---|---|
| *G06F 11/00* | (2006.01) |
| *G06F 11/10* | (2006.01) |
| *G06F 11/20* | (2006.01) |
| *H03M 13/15* | (2006.01) |

(52) U.S. Cl.
CPC ...... *G06F 11/1088* (2013.01); *G06F 11/2094* (2013.01); *H03M 13/1515* (2013.01); *H03M 13/154* (2013.01); *G06F 2201/82* (2013.01)

(58) Field of Classification Search
CPC .................. G06F 11/1088; G06F 11/2094
See application file for complete search history.

(56) References Cited

U.S. PATENT DOCUMENTS

| | | | | |
|---|---|---|---|---|
| 11,288,138 | B1 * | 3/2022 | Freilich | G06F 11/2094 |
| 11,630,729 | B2 * | 4/2023 | Menon | H03M 13/1515 |
| | | | | 714/6.12 |
| 2020/0319972 | A1 * | 10/2020 | Tang | G06F 3/0659 |

* cited by examiner

*Primary Examiner* — Michael Maskulinski
(74) *Attorney, Agent, or Firm* — Alleman Hall & Tuttle LLP

(57) ABSTRACT

This disclosure describes techniques that include implementing network-efficient data durability or data reliability coding on a network. In one example, this disclosure describes a method that includes generating a plurality of data fragments from data to enable reconstruction of the data from a subset of the plurality of data fragments; storing, across a plurality of nodes in a network, the plurality of data fragments, wherein storing the plurality of data fragments includes storing the first fragment at a first node and the second fragment at a second node; and generating, by the first node, a plurality of secondary fragments derived from the first fragment to enable reconstruction of the first fragment from a subset of the plurality of secondary fragments; and storing the plurality of secondary fragments from the first fragment across a plurality of storage devices included within the first node.

20 Claims, 15 Drawing Sheets

RELIABILITY CODING WITH REDUCED NETWORK TRAFFIC

CROSS REFERENCE

This application is a continuation application of and claims priority to U.S. patent application Ser. No. 17/302,173 filed on Apr. 26, 2021, which claims the benefit of U.S. Provisional Patent Application No. 63/016,137 filed on Apr. 27, 2020, which is hereby incorporated by reference herein in its entirety.

TECHNICAL FIELD

This disclosure relates to information storage and processing packets of information, for example, in the fields of networking, storage, and cryptography.

BACKGROUND

In a typical cloud-based data center, a large collection of interconnected servers provides computing and/or storage capacity for execution of various applications. For example, a data center may comprise a facility that hosts applications and services for subscribers, i.e., customers of the data center. The data center may, for example, host all of the infrastructure equipment, such as compute nodes, networking and storage systems, power systems, and environmental control systems. In most data centers, clusters of storage systems and application servers are interconnected via a high-speed switch fabric provided by one or more tiers of physical network switches and routers. Data centers vary greatly in size, with some public data centers containing hundreds of thousands of servers, and are usually distributed across multiple geographies for redundancy.

In a large scale fabric, storage systems or data within a storage system may become unavailable from time to time, due to hardware error, software error, or another reason. Data durability procedures may be employed to ensure access to critical data.

SUMMARY

This disclosure describes techniques that include data durability or data reliability coding, including network-efficient data durability or data reliability coding on a network. In some examples, techniques described herein may involve a data processing unit or access node (e.g., a master node) storing data in fragments across multiple fault domains in a manner that enables efficient recovery of the data, even if only a subset of the data is available. Data fragments within each fault domain may be further processed when stored, by data durability logic within the fault domain, to implement an additional or second level of data durability. Corrupted, lost, or otherwise unavailable data may be reconstructed using various data fragments while, in some cases, also minimizing or reducing network traffic.

In some examples, techniques described herein tend to reduce the number of read-modify-write cycles by accumulating data at a receiving or master node, and then storing data across the network once a sufficient amount of data has been accumulated. The master node may generate data blocks from the accumulated data using an erasure coding algorithm, and then store the data blocks across the network in other nodes. Each node may shard a data block to be stored at the node and store the shards and additional parity information (i.e., secondary data fragments) using a data durability scheme that protects against a storage failure at the node. Such a technique may enable the node to recover data lost due to a failure of one or more storage devices at the node. In some cases, such data may be recovered through operations performed within a node, and without requiring data fragments stored at other nodes.

The techniques described herein may provide some technical advantages. For instance, in examples where a second-level or separately-implemented reliability coding process is implemented for data stored at a node, reliability of data across the system or network may be enhanced, since a node may be able to regenerate lost data without relying on data durability coding implemented across multiple nodes or across durability schemes implemented using nodes spanning a network. Further, by avoiding use of data durability coding that may be implemented network-wide, network traffic generated by at least some data rebuilding operations may be reduced, thereby enabling more network bandwidth to be consumed by users of the network for productive purposes. In addition, aspects of the present disclosure may enable faster rebuild times in some situations, including in situations in which one or more components of a node (e.g., a storage drive) has failed.

In some examples, this disclosure describes operations performed by a network node or other network device in accordance with one or more aspects of this disclosure. In one specific example, this disclosure describes a method comprising generating a plurality of data fragments (which may include parity fragments) from a set of data to enable reconstruction of the set of data from a subset of the plurality of data fragments, wherein the plurality of data fragments includes a first fragment and a second fragment; storing, across a plurality of nodes in a network, the plurality of data fragments, wherein storing the plurality of data fragments includes storing the first fragment at a first node and the second fragment at a second node; generating, by the first node, a plurality of secondary fragments derived from the first fragment to enable reconstruction of the first fragment from a subset of the plurality of secondary fragments; storing the plurality of secondary fragments (which may include parity fragments) from the first fragment across a plurality of storage devices included within the first node, wherein storing the plurality of secondary fragments includes storing each of the plurality of secondary fragments in a different one of the plurality of storage devices; and reconstructing the set of data from a subset of the plurality of data fragments, wherein reconstructing the set of data includes reconstructing the first fragment from a subset of the plurality of secondary fragments.

In another example, this disclosure describes a storage system comprising a plurality of nodes connected by a network, wherein the storage system is configured to be capable of performing operations comprising: generating a plurality of data fragments from a set of data to enable reconstruction of the set of data from a subset of the plurality of data fragments, wherein the plurality of data fragments includes a first fragment and a second fragment; storing, across the plurality of nodes in a network, the plurality of data fragments, wherein storing the plurality of data fragments includes storing the first fragment at a first node and the second fragment at a second node, wherein the first node and the second node are included within the plurality of nodes; generating a plurality of secondary fragments derived from the first fragment to enable reconstruction of the first fragment from a subset of the plurality of secondary fragments; storing the plurality of secondary fragments from the first fragment across a plurality of storage devices included within the first node, wherein storing the plurality of secondary fragments includes storing each of the plurality of secondary fragments in a different one of the plurality of storage devices; and reconstructing the set of data from a subset of the plurality of data fragments, wherein reconstructing the set of data includes reconstructing the first fragment from a subset of the plurality of secondary fragments.

In another example, this disclosure describes a computer-readable storage medium comprising instructions that, when executed, configure processing circuitry of a storage system to perform operations comprising: generating a plurality of data fragments from a set of data to enable reconstruction of the set of data from a subset of the plurality of data fragments, wherein the plurality of data fragments includes a first fragment and a second fragment; storing, across a plurality of nodes in a network, the plurality of data fragments, wherein storing the plurality of data fragments includes storing the first fragment at a first node and the second fragment at a second node; generating, by the first node, a plurality of secondary fragments derived from the first fragment to enable reconstruction of the first fragment from a subset of the plurality of secondary fragments; storing the plurality of secondary fragments from the first fragment across a plurality of storage devices included within the first node, wherein storing the plurality of secondary fragments includes storing each of the plurality of secondary fragments in a different one of the plurality of storage devices; and reconstructing the set of data from a subset of the plurality of data fragments, wherein reconstructing the set of data includes reconstructing the first fragment from a subset of the plurality of secondary fragments.

DETAILED DESCRIPTION

Figure 1:
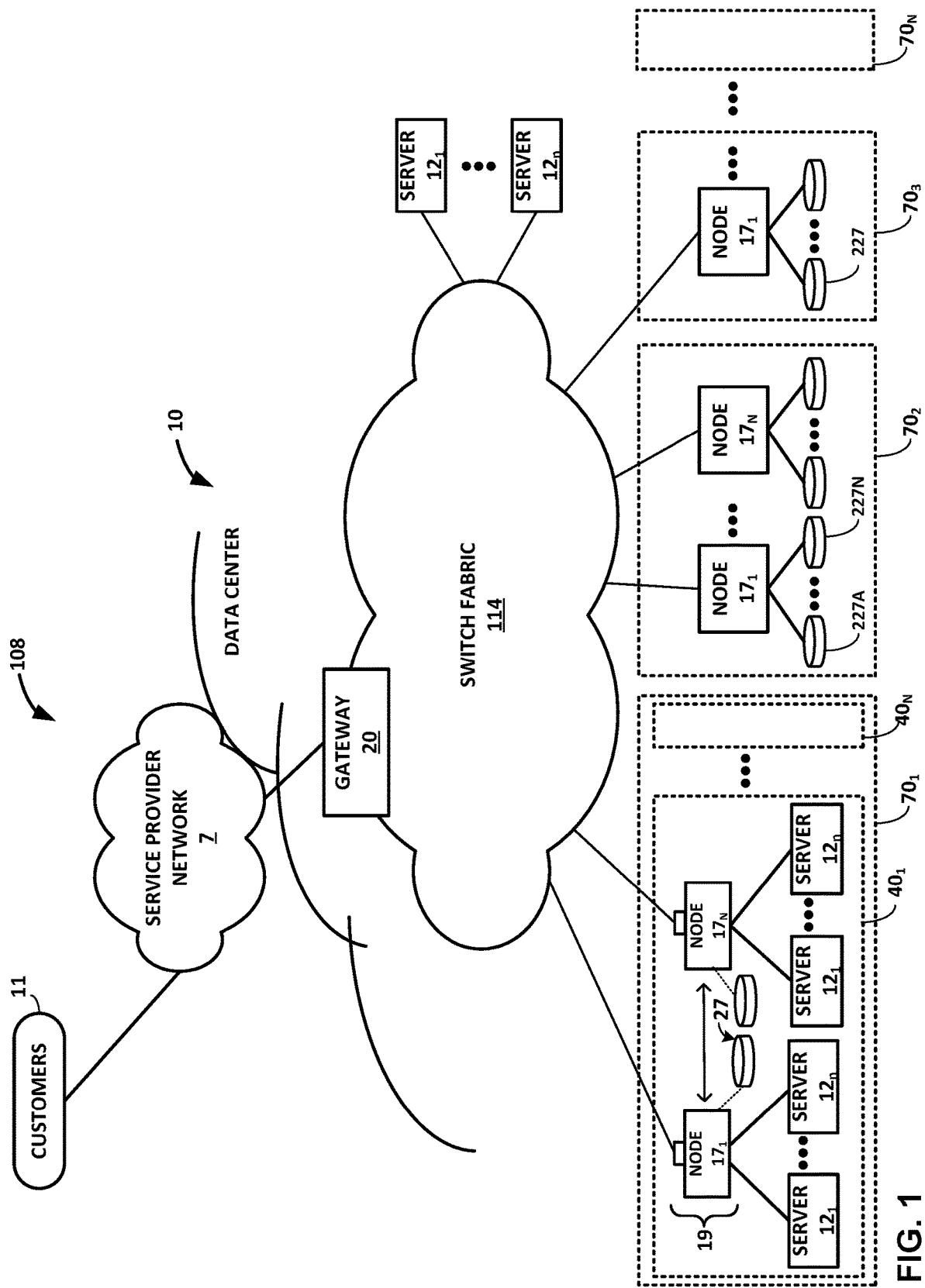
FIG. 1 is a block diagram illustrating an example system including one or more network devices configured to efficiently process a series of work units in a multiple core processor system.

This disclosure describes techniques that include implementing network-efficient data durability or data reliability coding on a network. Storage systems may be implemented in various ways, including as scale-up storage systems or scale-out storage systems. In both types of storage systems, data durability procedures, such as replication, erasure coding, RAID or other procedures may be employed to make data reliably available.

Replication, RAID or Erasure coding (EC) may be used to protect data on drives. Typically, extra space is introduced to the storage system for data protection. In replication, a second or third copy of the data is also stored, and the overhead, or extra space needed is on the order of one hundred percent or more. In RAID schemes, the extra space stores parity information. Overhead or extra space for RAID may be of the order of 1/8. In erasure coding schemes, the extra storage space is used to store Reed Solomon codes. The overhead for erasure coding tends to be similar to RAID schemes. In general, RAID schemes are sometimes limited in the number of simultaneous failures that can be handled, whereas erasure coding schemes can be more flexible. For example, a RAID-5 scheme protects against a single disk failure and a RAID-6 scheme can protect against the failure of 2 simultaneous drives. On the other hand, a 72+8 EC scheme allows the failure of up to 8 drives simultaneously from among a group of 80 drives.

In scale-up storage systems, individual nodes are built to be highly available, and drive and processor failures are repaired generally without involving other nodes. Processor failures are handled by another processor in the node taking over the work of the failed processor. Drive failures are handled by rebuilding the data to spare space on other surviving drives in the node.

In scale-out storage systems, individual nodes are often not designed to be highly available. Node failures or drive failures are handled by rebuilding data from the failed node to spare space on drives in other nodes. When a node fails, the data from all the drives in the node are rebuilt elsewhere, often by other nodes rebuilding data using data available from other nodes on the network.

Although techniques described herein may apply to both types of systems, many of the techniques described herein may be particularly applicable to scale-out systems. In scale-out systems, the replication, RAID, or erasure coding may be performed across various failure domains, such as across nodes within a storage system. For a 4+2 erasure coding system, 6 nodes are involved. The failure of a block of data on a drive will typically require reading corresponding blocks of data from drives on 4 other nodes to rebuild the lost data. This incurs network traffic on the node to node network. The failure of an entire drive will typically require rebuilding all the blocks of data on that failed drive, and each block can be rebuilt as described above. The failure of a node or of the processor in the node will require rebuilding all the blocks of data on all the drives in that node.

FIG. 1 is a block diagram illustrating an example system 108 including one or more network devices configured to efficiently process and store data reliably in a multiple core processor system. As described herein, techniques for performing data durability coding may provide technical benefits that enhance data reliability and reduce network traffic in some situations, including when recovering from data loss. Nodes or nodes as described herein may also be referred to as data processing units (DPUs), or devices including DPUs, in this disclosure. In the example of FIG. 1, various data structures and processing techniques are described with respect to nodes 17 within a data center 10. Other devices within a network, such as routers, switches, servers, firewalls, gateways and the like, having multiple core processor systems may readily be configured to utilize the data processing techniques described herein.

Data center 10 represents an example of a system in which various techniques described herein may be implemented. In general, data center 10 provides an operating environment for applications and services for customers 11 coupled to the data center by service provider network 7 and gateway device 20. Data center 10 may, for example, host infrastructure equipment, such as compute nodes, networking and storage systems, redundant power supplies, and environmental controls. Service provider network 7 may be coupled to one or more networks administered by other providers, and may thus form part of a large-scale public network infrastructure, e.g., the Internet.

In some examples, data center 10 may represent one of many geographically distributed network data centers. In the example of FIG. 1, data center 10 is a facility that provides information services for customers 11. Customers 11 may be collective entities such as enterprises and governments or individuals. For example, a network data center may host web services for several enterprises and end users. Other exemplary services may include data storage, virtual private networks, file storage services, data mining services, scientific- or super-computing services, and so on.

In the illustrated example, data center 10 includes a set of storage systems and application servers 12 interconnected via a high-speed switch fabric 114. In some examples, servers 12 are arranged into multiple different server groups, each including any number of servers up to, for example, n servers 12$_1$-12$n$. Servers 12 provide computation and storage facilities for applications and data associated with customers 11 and may be physical (bare-metal) servers, virtual machines running on physical servers, virtualized containers running on physical servers, or combinations thereof.

In the example of FIG. 1, some of servers 12 may be coupled to switch fabric 114 by one or more nodes 17 for processing streams of information, such as network packets or storage packets. In example implementations, nodes 17 may be configurable to operate in a standalone network appliance having one or more nodes. For example, nodes 17 may be arranged into multiple different node groups 19, each including any number of nodes up to, for example, "N" nodes 17$_1$-17$_N$ (representing any number of nodes 17). In other examples, each node may be implemented as a component (e.g., electronic chip) within a device, such as a compute node, application server, storage server, and may be deployed on a motherboard of the device or within a removable card, such as a storage and/or network interface card.

In the example shown in FIG. 1, some nodes 17 are shown connected to one or more servers 12, and such nodes 17 may serve to offload (from servers 12) aspects of the handling of data packets and other network-related functions. These nodes are shown logically or physically organized within node groups 19, units 40, and racks 70. Specifically, rack 70-1 includes one or more node groups 19, each including a set of nodes 17 and storage devices 27. The node group and the set of servers 12 supported by the nodes 17 of the node group 19 may be referred to herein as a network storage compute unit (NCSU) 40. Illustrated in FIG. 1 are NCSU 40-1 through NCSU 40-N, which represent any number of NCSUs. (For ease of illustration, only components of NCSU 40-1 are shown.) In some examples, data center 10 may include many NCSUs, and multiple NCSUs 40 may be organized into logical racks or physical racks within data center 10. For example, in some implementations, two NCSUs may compose a logical rack, and four NCSUs may compose a physical rack 70-1. Other arrangements are possible. Such other arrangements may include nodes 17 within rack 70-1 being relatively independent, and not logically or physically included within any node group or NCSUs 40.

In general, each node group 19 of rack 70-1 may be configured to operate as a high-performance I/O hub designed to aggregate and process network and/or storage I/O for multiple servers 12. As mentioned above, the set of nodes 17 within each of the node groups 19 provide programmable, specialized I/O processing circuits for handling networking and communications operations on behalf of servers 12. In addition, in some examples, each of node groups 19 may include storage devices 27, such as solid state drives (SSDs) and/or hard disk drives (HDDs), configured to provide network accessible storage for use by applications executing on the servers 12. In some examples, one or more of the SSDs may comprise non-volatile memory (NVM) or flash memory. Although illustrated as logically within node groups 19 and external to nodes 17, storage devices may alternatively or in addition be included within one or more nodes 17 or within one or more servers 12.

Other nodes 17 may serve as storage nodes that might not be directly connected to any of servers 12. For instance, FIG. 1 illustrates rack 70-2, which includes nodes 17-1 through 17-N (representing any number of nodes 17). These nodes 17 may be configured to store data within one or more storage devices 227 (included within or connected to such nodes 17) in accordance with techniques described herein. In the example illustrated, nodes 17 within rack 70-2 are not organized into groups or units, but instead, are relatively independent of each other, and are each capable of performing storage functions described herein. In other examples, however, nodes 17 of rack 70-2 may be logically or physically organized into groups, units, and/or logical racks as appropriate.

Rack 70-3 is illustrated as being implemented in a manner similar to rack 70-2, with storage nodes 17 configured to store data within storage devices. Although for ease of illustration, only racks 70-1, 70-2, 70-3, through 70-N are illustrated or represented in FIG. 1, any number of racks 70 may be included within data center 10. Further, although rack 70-1 in FIG. 1 is illustrated with nodes 17 that support servers 12 and other racks 70 are illustrated with nodes 17 serving as storage nodes, in other examples, any number of racks may include nodes 17 that support servers 12, and any number of racks may include nodes serving as storage nodes. Further, any of racks 70 may include a mix of nodes 17 supporting servers 12 and nodes 17 serving as storage nodes. Still further, although data center 10 is illustrated in the context of nodes 17 being arranged within racks 70, other logical or physical arrangements of nodes 17 may be used in other implementations, and such other implementation may involve groups, units, or other logical or physical arrangements not involving racks.

Nodes 17 of rack 70-2 (or rack 70-3) may be devices or systems that are the same as or similar to nodes 17 of rack 70-1. In other examples, nodes 17 of rack 70-2 may have different capabilities than those of rack 70-1 and/or may be implemented differently. In particular, nodes 17 of rack 70-2 may be somewhat more capable than nodes 17 of rack 70-1, and may have more computing power, more memory capacity, more storage capacity, and/or additional capabilities. For instance, each of nodes 17 of rack 70-2 may be implemented by using a pair of nodes 17 of rack 70-1. To reflect such an example, nodes 17 of rack 70-2 and 70-3 are illustrated in FIG. 1 as being larger than nodes 17 of rack 70-1.

In a large scale fabric, storage systems (e.g., represented by nodes 17 of rack 70-2 or even NCSUs 40 of rack 70-1) may become unavailable from time to time. Failure rates of storage systems are often significant, even if single component failure rates are quite small. Further, storage systems may become unavailable for reasons other than a software error or hardware malfunction, such as when a storage system or other device is being maintained or the software on such a device is being modified or upgraded. Accordingly, as further described herein, data durability procedures may be employed to ensure access to critical data stored on a network when one or more storage systems are unavailable.

In some examples, one or more hardware or software subsystems may serve as a failure domain or fault domain for storing data across data center 10. For instance, in some examples, a failure domain may be chosen to include hardware or software subsystems within data center 10 that are relatively independent, such that a failure (or unavailability) of one such subsystem is relatively unlikely to be correlated with a failure of another such subsystem. Storing data fragments in different failure domains may therefore reduce the likelihood that more than one data fragment will be lost or unavailable at the same time. In some examples, a failure domain may be chosen at the node level, where each node represents a different failure domain. In another example, a failure domain may be chosen at a logical or physical grouping level, such that each group or unit of nodes 17 represents a different failure domain. In other examples, failure domains may be chosen more broadly, so that a failure domain encompasses a logical or physical rack 70 comprising many nodes 17. Broader or narrower definitions of a failure domain may also be appropriate in various examples, depending on the nature of the network 8, data center 10, or subsystems within data center 10.

As further described herein, in one example, each node 17 may be a highly programmable I/O processor specially designed for performing storage functions and/or for offloading certain functions from servers 12. In one example, each node 17 includes a number of internal processor clusters, each including two or more processing cores and equipped with hardware engines that offload cryptographic functions, compression and regular expression (RegEx) processing, data durability functions, data storage functions and networking operations. In such an example, each node 17 may include components for processing and storing network data (e.g., nodes 17 of rack 70-2) and/or for and processing network data on behalf of one or more servers 12 (e.g., nodes 17 of rack 70-1). In addition, some or all of nodes 17 may be programmatically configured to serve as a security gateway for its respective servers 12, freeing up other computing devices (e.g., the processors of the servers 12) to dedicate resources to application workloads.

In some example implementations, some nodes 17 may be viewed as network interface subsystems that serve as a data storage node configured to store data across storage devices 227. Other nodes 17 in such implementations may be viewed as performing full offload of the handling of data packets (with, in some examples, zero copy in server memory) and various data processing acceleration for the attached server systems.

In one example, each node 17 may be implemented as one or more application-specific integrated circuit (ASIC) or other hardware and software components, each supporting a subset of storage devices 227 or a subset of servers 12. In accordance with the techniques of this disclosure, any or all of nodes 17 may include a data durability module or unit, which may be implemented as a dedicated module or unit for efficiently and/or quickly performing data durability operations. In some examples, such a module or unit may be referred to as an "accelerator" unit. That is, one or more computing devices may include a node including one or more data durability, data reliability, and/or erasure coding accelerator units, according to the techniques of this disclosure.

The data durability module or unit of the node, according to the techniques of this disclosure, may be configured to store data in fragments across multiple fault domains in a manner that enables efficient recovery of the data using or based on a subset of the data fragments. When storing data, the data durability accelerator unit may encode data using any of a variety of data durability, RAID, or erasure coding schemes that enable recovery of data when one or more of such fragments are unavailable due to software or hardware error, or for another reason, such as modifications (e.g., software upgrades) being performed on the storage unit where a data fragment is being stored. Further, the data durability accelerator unit may provide a flexible and/or configurable data durability system by applying a unified approach to implementing a variety of data durability coding schemes. In some examples, the data durability accelerator may implement multiple data durability coding schemes or algorithms through a common matrix approach, such as that described in U.S. patent application Ser. No. 16/265,606, filed Feb. 1, 2019, entitled "FLEXIBLE RELIABILITY CODING FOR STORAGE ON A NETWORK," which is hereby incorporated by reference.

In the example of FIG. 1, each node 17 provides storage services (e.g., nodes 17 of rack 70-2) or connectivity to switch fabric 114 for a different group of servers 12 (e.g., nodes 17 of rack 70-1). Each of nodes 17 may be assigned respective IP addresses and provide routing operations for servers or storage devices coupled thereto. Nodes 17 may interface with and utilize switch fabric 114 so as to provide full mesh (any-to-any) interconnectivity such that any nodes 17 (or servers 12) may communicate packet data for a given packet flow to any node 17 using any of a number of parallel data paths within the data center 10. In addition, nodes 17 described herein may provide additional services, such as storage (e.g., integration of solid-state storage devices), security (e.g., encryption), acceleration (e.g., compression), data reliability (e.g., erasure coding), I/O offloading, and the like. In some examples, each of nodes 17 may include or have access to storage devices, such as high-speed solid-state drives or rotating hard drives, configured to provide network accessible storage for use by applications executing on the servers. More details on the data center network architecture and interconnected nodes illustrated in FIG. 1 are available in U.S. Provisional Patent Application No. 62/514,583, filed Jun. 2, 2017, entitled "Non-Blocking Any-to-Any Data Center Network with Packet Spraying Over Multiple Alternate Data Paths," the entire content of which is incorporated herein by reference.

Figure 2:
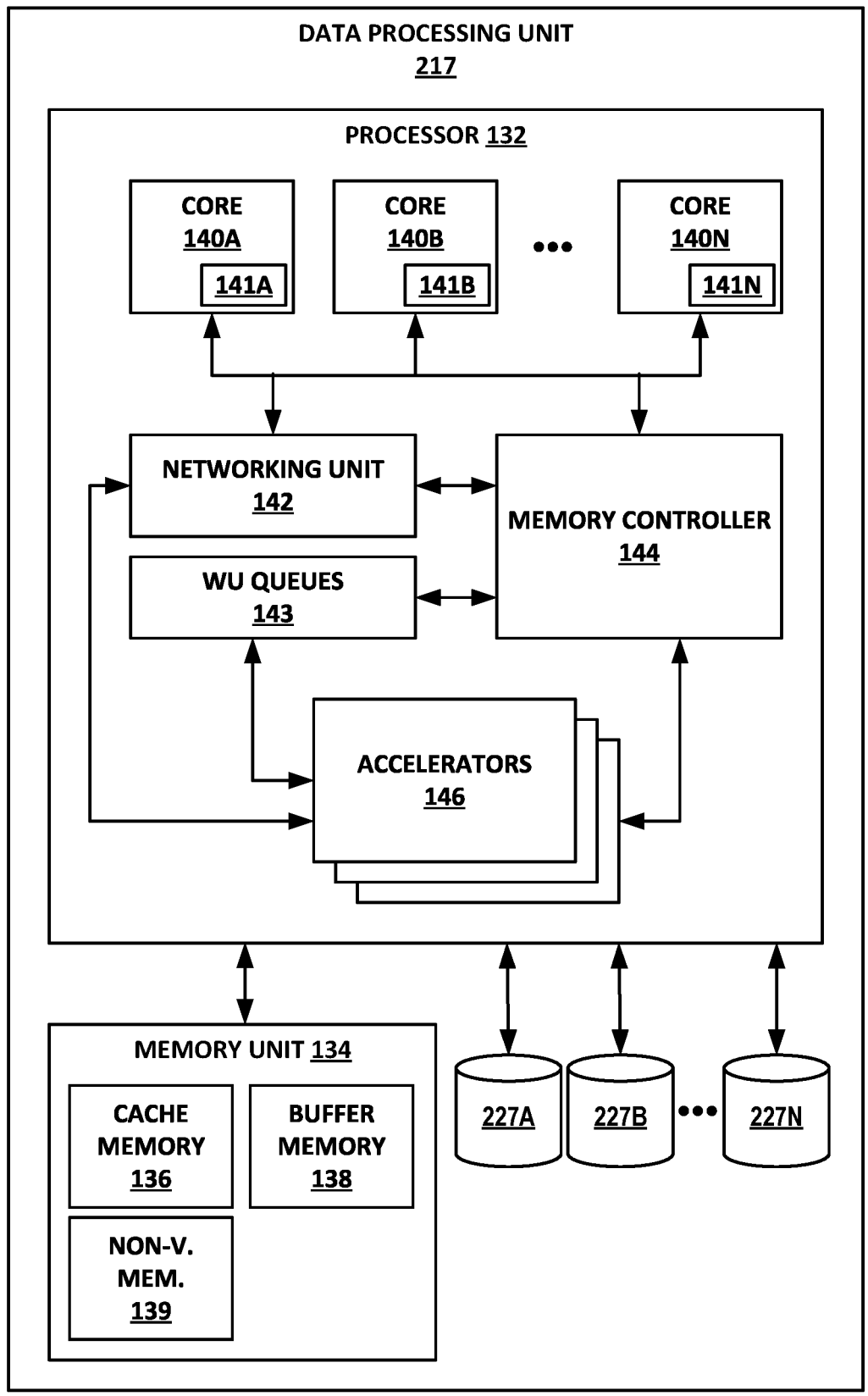
FIG. 2 is a block diagram illustrating an example node or data processing unit (DPU) including two or more processing cores, in accordance with the techniques of this disclosure.
Figure 3:
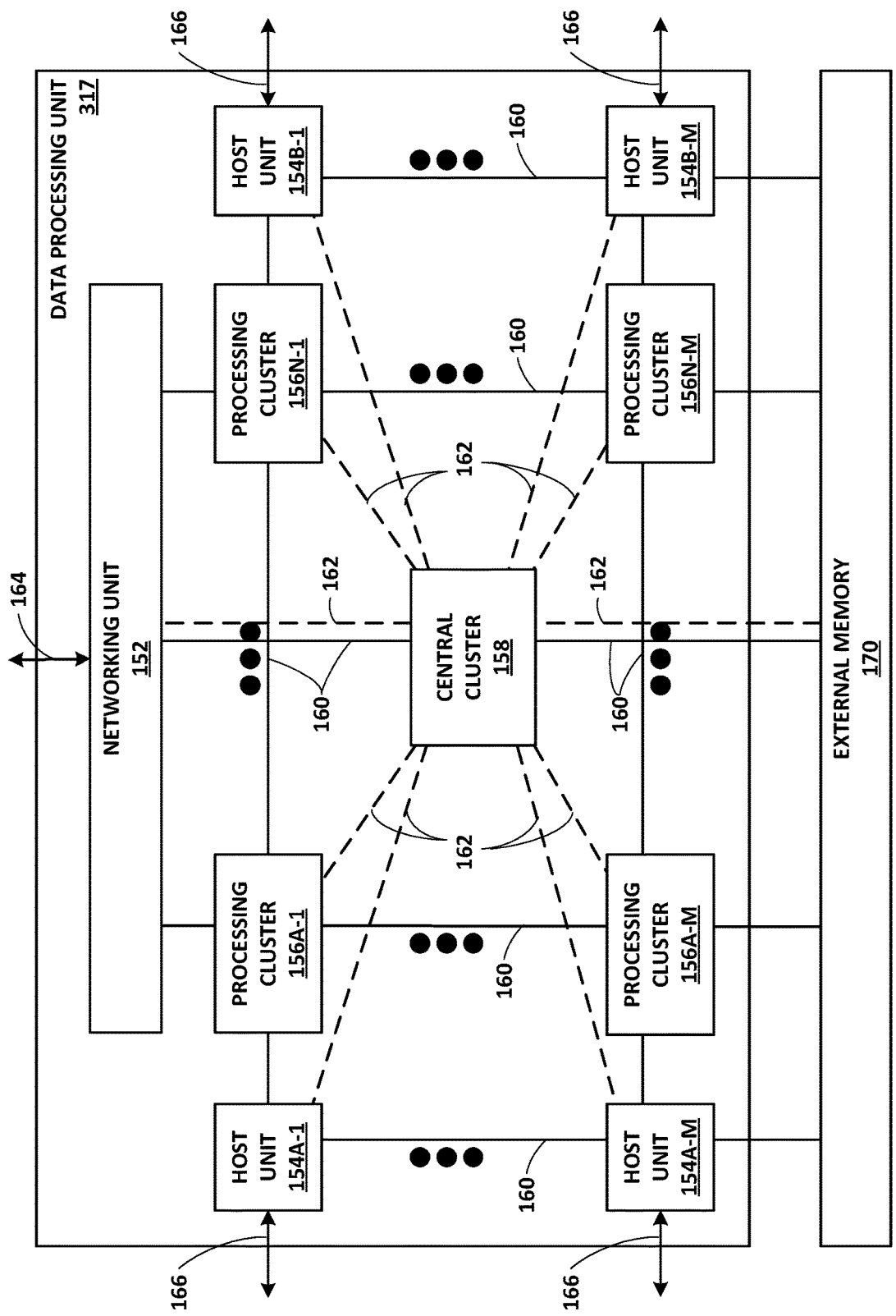
FIG. 3 is a block diagram illustrating another example of a DPU including two or more processing clusters, in accordance with the techniques of this disclosure.

Example architectures of nodes 17 are described herein with respect to FIG. 2 and FIG. 3. For some or all of such examples, the architecture of each node 17 comprises a multiple core processor system that represents a high performance, hyper-converged network, storage, and data processor and input/output hub. The architecture of each node 17 may be optimized for high performance and high efficiency stream processing. For purposes of example, DPUs corresponding to or within each node 17 may execute an operating system, such as a general-purpose operating system (e.g., Linux or other flavor of Unix) or a special-purpose operating system, that provides an execution environment for data plane software for data processing.

More details on how nodes 17 may operate are available in U.S. Provisional Patent Application No. 62/589,427, filed Nov. 21, 2017, entitled "Work Unit Stack Data Structures in Multiple Core Processor System," and U.S. Provisional Patent Application No. 62/625,518, entitled "EFFICIENT WORK UNIT PROCESSING IN A MULTICORE SYSTEM", filed Feb. 2, 2018, and in U.S. patent application Ser. No. 16/031,676, filed Jul. 10, 2018, entitled "Access Node Integrated Circuit for Data Centers which Includes a Networking Unit, a Plurality of Host Units, Processing Clusters, a Data Network Fabric, and a Control Network Fabric,". All of these applications are hereby incorporated by reference.

In FIG. 1, and in accordance with one or more aspects of the present disclosure, one or more of nodes 17 may perform operations relating to providing data durability within across data center 10. For instance, in an example that can be described in the context of FIG. 1, node 17-1 of rack 70-2 receives data over switch fabric 114. In some examples, such data may originate from one or more of servers 12 within rack 70-1 or from one or more of servers 12 not included with rack 70-1 (i.e., one or more of servers 12 illustrated in FIG. 1 as directly interfacing with switch fabric 114). Node 17-1 of rack 70-2 processes the received data by applying a data durability encoding algorithm. In some examples, the data durability encoding algorithm is a Reed Solomon erasure coding algorithm that results in the data being split into multiple data fragments. In addition, the multiple data fragments are used to generate one or more parity data fragments. Performing an erasure coding operation may, in some examples, require significant computing resources.

Node 17-1 of rack 70-2 may store data across data center 10. For instance, in an example that can be described in the context of FIG. 1, node 17-1 of rack 70-2 splits data into fragments. Node 17-1 also generates parity data fragments from the split data fragments. Node 17-1 outputs, over switch fabric 114, each of the data fragments and parity fragments to a different node 17 for storage. In the example of FIG. 1, each of nodes 17 being used as a storage node (e.g., nodes 17 within racks 70-2 or 70-3) is considered a different fault domain (or primary fault domain), so node 17-1 of rack 70-2 stores each of the data fragments within a different node 17. In some examples, such nodes receiving a data fragment may include other nodes within rack 70-2 and/or any of nodes 17 within racks 70-3 through 70-N. If the failure of one node 17 is unlikely to be correlated with the failure of another node 17, storing data fragments in different nodes 17 may reduce the likelihood that more than one data fragment will be lost or unavailable due to a hardware or software error (or other cause of unavailability). In other examples, a fault domain may be chosen at the rack level, such that no more than one data fragment is stored in any given rack 70.

Within each of nodes 17 receiving a different data fragment, each node 17 may perform additional or secondary data durability processes on the received data fragment. For instance, again with reference to an example that can be described in the context of FIG. 1, each of nodes 17 receiving a data fragment from node 17-1 of rack 70-2 splits the received data fragment into secondary data fragments or segments. Each of such nodes 17 further generate one or more parity data fragments that can be used to recover the data fragment if one or more of the secondary data fragments are lost. Each of nodes 17 store the secondary data fragments and the parity data fragments in a separate one of storage devices 227. Although storage devices 227 are illustrated separately from each of nodes 17 in FIG. 1, in other examples, the storage devices 227 may be included within respective nodes 17.

After storing the data fragments, node 17-1 of rack 70-2 may receive a request (e.g., a "read" request) for a portion of or all of the stored data that was stored across data center 10 as data fragments. For instance, in the example of FIG. 1, node 17-1 of rack 70-2 may receive a request over switch fabric 114, from one of servers 12, to read some portion of the data that node 17 of rack 70-2 stored as data fragments across data center 10, as described above. After receiving the request, node 17-1 of rack 70-2 accesses a directory, stored within node 17-1 of rack 70-2 or elsewhere, identifying where each of the data fragments are stored within data center 10. Node 17-1 of rack 70-2 determines whether the requested data is available at the location specified in the directory. If the requested data is available, node 17-1 of rack 70-2 retrieves the data from the specified location (e.g., from one or more of storage devices 227 connected to the identified storage node 17) and responds to the read request from server 12 by sending the original data back over the switch fabric to the server 12.

If one or more of the data fragments is not available, however, node 17-1 of rack 70-2 accesses one or more of the parity data fragments and uses the parity data fragments, along with the available data fragments, to reconstruct the original data. To do so, node 17-1 performs a data durability decoding operation to reconstruct the data. If the data was encoded using a Reed Solomon erasure coding algorithm, for example, the decoding operation involves a corresponding Reed Solomon decoding operation. As with the encoding operation, the decoding operation may be a computationally intensive operation. When the decode operation is complete, the requested data, which may be a subset of the reconstructed data, is output to the requesting server 12 over switch fabric 114 as a response to the read request.

In some examples, if data is lost at a given storage node 17, but the node 17 is still operational, that node 17 may be able to reconstruct the data from other data stored at the node 17, without relying on the erasure coding system implemented across network 108. As further described herein, by storing additional parity data at a storage node 17, each storage node 17 may have the capability of independently recovering from some storage failures using other data stored at the node 17, without relying on fragments stored at other nodes. By not relying on fragment stored at other nodes (i.e., relying on the erasure coding system implemented across network 108), that node 17 may be able to avoid generating network traffic on network 108 when recovering data.

Further details relating to techniques for reliability coding and storage of data to support erasure coding are available in U.S. patent application Ser. No. 16/215,178, filed Dec. 10, 2018, entitled "Durable Block Storage in Data Center Access Nodes with Inline Erasure Coding," U.S. patent application Ser. No. 16/169,736, filed Oct. 24, 2018, entitled "INLINE RELIABILITY CODING FOR STORAGE ON A NETWORK," and U.S. patent application Ser. No. 16/265,606, filed Feb. 1, 2019, entitled "FLEXIBLE RELIABILITY CODING FOR STORAGE ON A NETWORK,". The entire content of all of these applications is incorporated herein by reference.

FIG. 2 is a block diagram illustrating an example node or data processing unit (DPU) 217 including two or more processing cores, in accordance with the techniques of this disclosure. In some examples, DPU 217 represents a hardware chip implemented in digital logic circuitry and may be used in any computing or network device. DPU 217 may operate substantially similar to and generally represent any of nodes 17 of FIG. 1. In some implementations, nodes 17 of rack 70-1 may correspond to DPU 217 or processor 132 of FIG. 2, and nodes 17 of rack 70-2 and 70-3 may correspond to a pair of DPUs 217 or processors 132 of FIG. 2.

Thus, DPU 217 may be communicatively coupled to one or more network devices, server devices (e.g., servers 12), random access memory, storage media (e.g., solid state drives (SSDs)), storage devices 227, a data center fabric (e.g., switch fabric 114), or the like, e.g., via PCI-e, Ethernet (wired or wireless), or other such communication media. Moreover, DPU 217 may be implemented as one or more application-specific integrated circuit (ASIC), may be configurable to operate as a component of a network appliance or may be integrated with other DPUs within a device.

In the illustrated example of FIG. 2, DPU 217 includes one or more multi-core processors 132 having a plurality of programmable processing cores 140A-140N ("cores 140") coupled to an on-chip memory unit 134 and one or more storage devices 127A through 127N ("storage devices 127" and representing any number of storage devices). Each of cores 140 includes a level 1 cache 141 (level 1 caches 141A, 141B, and 141N are associated with cores 140A, 140B, and 140N, respectively).

Memory unit 134 may include two types of memory or memory devices, namely coherent cache memory 136, non-coherent buffer memory 138, and non-volatile memory 139 (e.g., NVDIMM memory). Processor 132 also includes a networking unit 142, work unit (WU) queues 143, a memory controller 144, and accelerators 146. Although not shown, processor 132 may also include a storage device controller used when accessing storage devices 127. As illustrated in FIG. 2, each of cores 140, networking unit 142, WU queues 143, memory controller 144, memory unit 134, and accelerators 146 are communicatively coupled to each other. In some examples, processor 132 of DPU 217 further includes one or more accelerators configured to perform acceleration for various data-processing functions, such as look-ups, matrix multiplication, cryptography, compression, regular expressions, or the like.

In this example, DPU 217 represents a high performance, hyper-converged network, storage, and data processor and input/output hub. For example, networking unit 142 may be configured to receive one or more data packets from and transmit one or more data packets to one or more external devices, e.g., network devices. Networking unit 142 may perform network interface card functionality, packet switching, and the like, and may use large forwarding tables and offer programmability. Networking unit 142 may expose Ethernet ports for connectivity to a network, such as switch fabric 114 of FIG. 1. DPU 217 may also include one or more interfaces for connectivity to host devices (e.g., servers) and data storage devices, e.g., solid state drives (SSDs) via PCIe lanes. DPU 217 may further include one or more high bandwidth interfaces for connectivity to off-chip external memory.

Processor 132 further includes accelerators 146 configured to perform acceleration for various data-processing functions, such as look-ups, matrix multiplication, cryptography, compression, data durability and/or reliability, regular expressions, or the like. For example, accelerators 146 may comprise hardware implementations of look-up engines, matrix multipliers, cryptographic engines, compression engines, or the like. In accordance with the techniques of this disclosure, at least one of accelerators 146 may represent a data durability unit that may be used to implement one or more data durability and/or reliability schemes. In some examples, such a data durability unit may be configured to perform matrix multiplication operations commonly performed in erasure coding schemes, such as Reed Solomon erasure coding schemes. Such a data durability unit may be configured to efficiently perform operations, such as those relating to Galois Field mathematics, that might be difficult and/or inefficient to perform using commonly available processors or other processing hardware. Further, such a data durability unit may be designed to perform and/or implement multiple different types of data durability schemes by configuring different matrices specific to each implementation.

Memory controller 144 may control access to on-chip memory unit 134 by cores 140, networking unit 142, and any number of external devices, e.g., network devices, servers, external storage devices, or the like. Memory controller 144 may be configured to perform a number of operations to perform memory management in accordance with the present disclosure. For example, memory controller 144 may be capable of mapping accesses from one of the cores 140 to either of coherent cache memory 136 or non-coherent buffer memory 138. More details on a bifurcated memory system that may be included in DPU 217 are available in U.S. Provisional Patent Application No. 62/483,844, filed Apr. 10, 2017, and titled "Relay Consistent Memory Management in a Multiple Processor System," the entire content of which is incorporated herein by reference.

Cores 140 may comprise one or more microprocessors without interlocked pipeline stages (MIPS) cores, advanced reduced instruction set computing (RISC) machine (ARM) cores, performance optimization with enhanced RISC-performance computing (PowerPC) cores, RISC Five (RISC-V) cores, or complex instruction set computing (CISC or x86) cores. Each of cores 140 may be programmed to process one or more events or activities related to a given data packet such as, for example, a networking packet or a storage packet. Each of cores 140 may be programmable using a high-level programming language, e.g., C, C++, or the like.

In FIG. 2, and in accordance with one or more aspects of the present disclosure, data processing unit 217 may receive a data fragment. For instance, in an example that can be described in the context of FIG. 1 and FIG. 2, networking unit 142 detects input. Networking unit 142 determines that the input corresponds to data intended to be stored across network 108. Networking unit 142 outputs the data to a data durability module included within accelerators 146. The data durability module splits the data into fragments ("split fragments"). The data durability module also generates one or more parity fragments, where the parity fragments are derived from the split fragments. In some examples, the parity fragments can be used to recover one or more of the split fragments, if one or more of such split fragments are lost. In some examples, the parity fragments are generated pursuant to a parity or erasure coding algorithm. The data durability module stores each of the split fragments and the parity fragments in a separate one of storage devices 227. If one or more of storage devices 227 fail, the data stored at the failed storage device 227 may be recovered using the data stored at the other storage devices 227.

Through techniques in accordance with one or more aspects of the present disclosure, such as by employing a second-level or separately-implemented reliability coding process for data stored at a node, reliability of data across the system or network may be enhanced, since a node may be able to regenerate lost data without relying on data durability coding implemented across nodes or network-wide. Further, by avoiding use of data durability coding that may be implemented network-wide, network traffic generated by at least some data rebuilding operations may be reduced, thereby enabling more network bandwidth to be consumed by users of the network for productive purposes. In addition, aspects of the present disclosure may enable faster rebuild times in some situations, including in situations in which a component of a node (e.g., a storage drive) has failed.

FIG. 3 is a block diagram illustrating another example of a DPU 317 including two or more processing clusters, in accordance with the techniques of this disclosure. In some examples, DPU 317 may operate substantially similar to and may represent any of the nodes 17 of FIG. 1, including nodes 17 of rack 70-1 and storage nodes 17 of racks 70-2 and 70-3. Thus, DPU 317 may be communicatively coupled to a data center fabric (e.g., switch fabric 114), one or more server devices (e.g., servers 12), storage media (e.g., SSDs), storage devices 227, one or more network devices, random access memory, or the like, e.g., via PCI-e, Ethernet (wired or wireless), or other such communication media in order to interconnect each of these various elements. DPU 317 generally represents a hardware chip implemented in digital logic circuitry. As various examples, DPU 317 may be provided as an integrated circuit mounted on a motherboard of a computing, networking and/or storage device or installed on a card connected to the motherboard of the device.

In general, DPU 317 may represent a high performance, hyper-converged network, storage, and data processor and input/output hub. As illustrated in FIG. 3, DPU 317 includes networking unit 152, processing clusters 156A-1 to 156N-M (processing clusters 156), host units 154A-1 to 154B-M (host units 154), and central cluster 158, and is coupled to external memory 170. Each of host units 154, processing clusters 156, central cluster 158, and networking unit 152 may include a plurality of processing cores, e.g., MIPS cores, ARM cores, PowerPC cores, RISC-V cores, or CISC or x86 cores. External memory 170 may comprise random access memory (RAM), dynamic random access memory (DRAM), or non-volatile memory.

As shown in FIG. 3, host units 154, processing clusters 156, central cluster 158, networking unit 152, and external memory 170 are communicatively interconnected via one or more specialized network-on-chip fabrics. A set of direct links 162 (represented as dashed lines in FIG. 3) forms a signaling network fabric that directly connects central cluster 158 to each of the other components of DPU 317, that is, host units 154, processing clusters 156, networking unit 152, and external memory 170. A set of grid links 160 (represented as solid lines in FIG. 3) forms a data network fabric that connects neighboring components (including host units 154, processing clusters 156, networking unit 152, and external memory 170) to each other in a two-dimensional grid.

Networking unit 152 has Ethernet interfaces 164 to connect to the switch fabric, and interfaces to the data network formed by grid links 160 and the signaling network formed by direct links 162. Networking unit 152 provides a Layer 3 (i.e., OSI networking model Layer 3) switch forwarding path, as well as network interface card (NIC) assistance. One or more hardware direct memory access (DMA) engine instances (not shown) may be attached to the data network ports of networking unit 152, which are coupled to respective grid links 160. The DMA engines of networking unit 152 are configured to fetch packet data for transmission. The packet data may be in on-chip or off-chip buffer memory (e.g., within buffer memory of one of processing clusters 156 or external memory 170), or in host memory.

Host units 154 each have PCI-e interfaces 166 to connect to servers and/or storage devices, such as SSD devices. This allows DPU 317 to operate as an endpoint or as a root. For example, DPU 317 may connect to a host system (e.g., a server) as an endpoint device, and DPU 317 may connect as a root to endpoint devices (e.g., SSD devices). Each of host units 154 may also include a respective hardware DMA engine (not shown). Each DMA engine is configured to fetch data and buffer descriptors from host memory, and to deliver data and completions to host memory.

DPU 317 may provide optimizations for stream processing. For instance, DPU 317 may execute an operating system that facilitates run-to-completion processing, which may eliminate interrupts, thread scheduling, cache thrashing, and associated costs. For example, an operating system may run on one or more of processing clusters 156. Central cluster 158 may be configured differently from processing clusters 156, which may be referred to as stream processing clusters. In one example, central cluster 158 executes the operating system kernel (e.g., Linux kernel) as a control plane. Processing clusters 156 may function in run-to-completion thread mode of a data plane software stack of the operating system. That is, processing clusters 156 may operate in a tight loop fed by work unit queues associated with each processing core in a cooperative multi-tasking fashion.

Figure 4A:
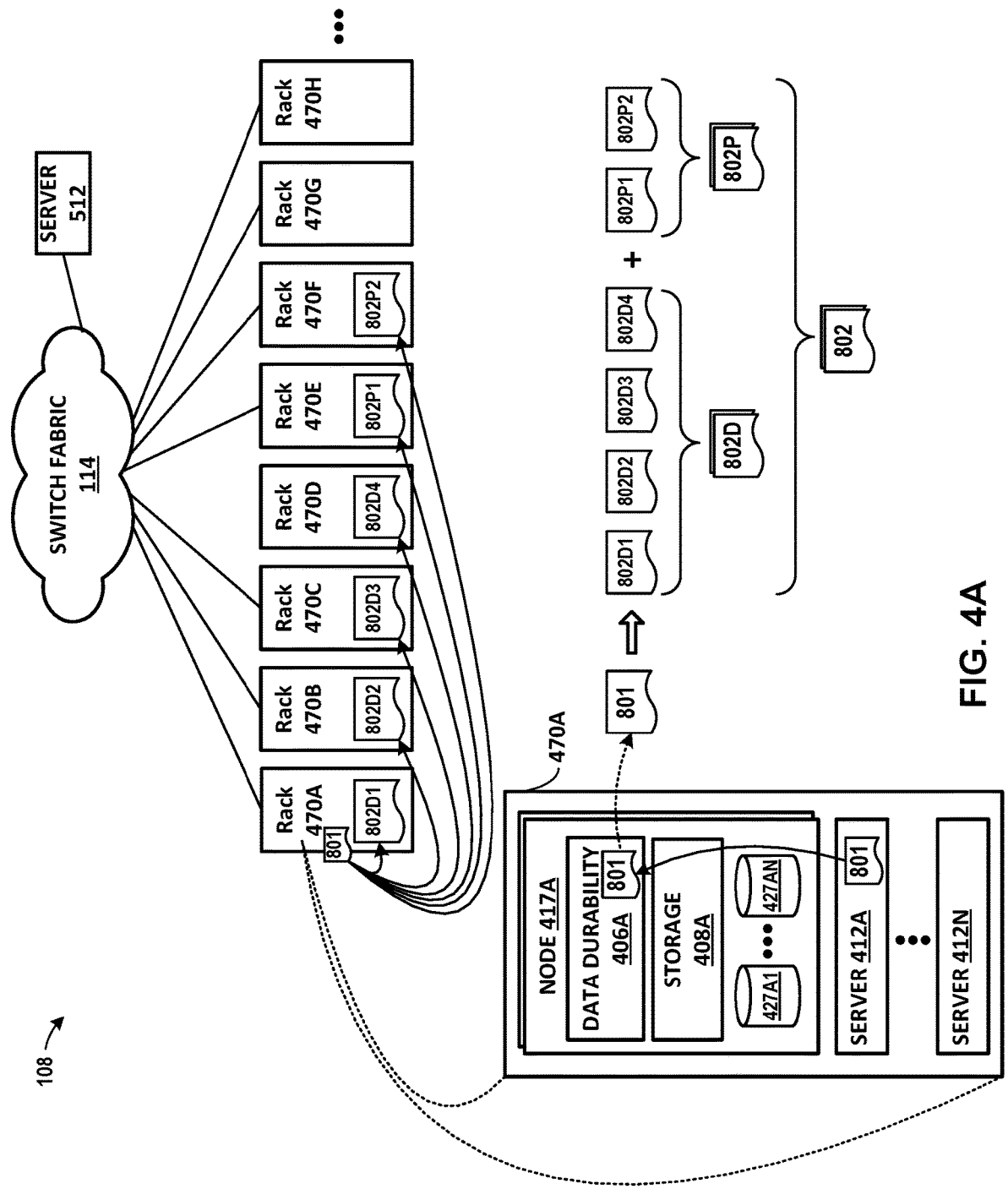
FIG. 4A and FIG. 4B are conceptual diagrams illustrating an example operation in which data is stored within network pursuant to a data reliability scheme, in accordance with one or more aspects of the present disclosure.
Figure 4B:
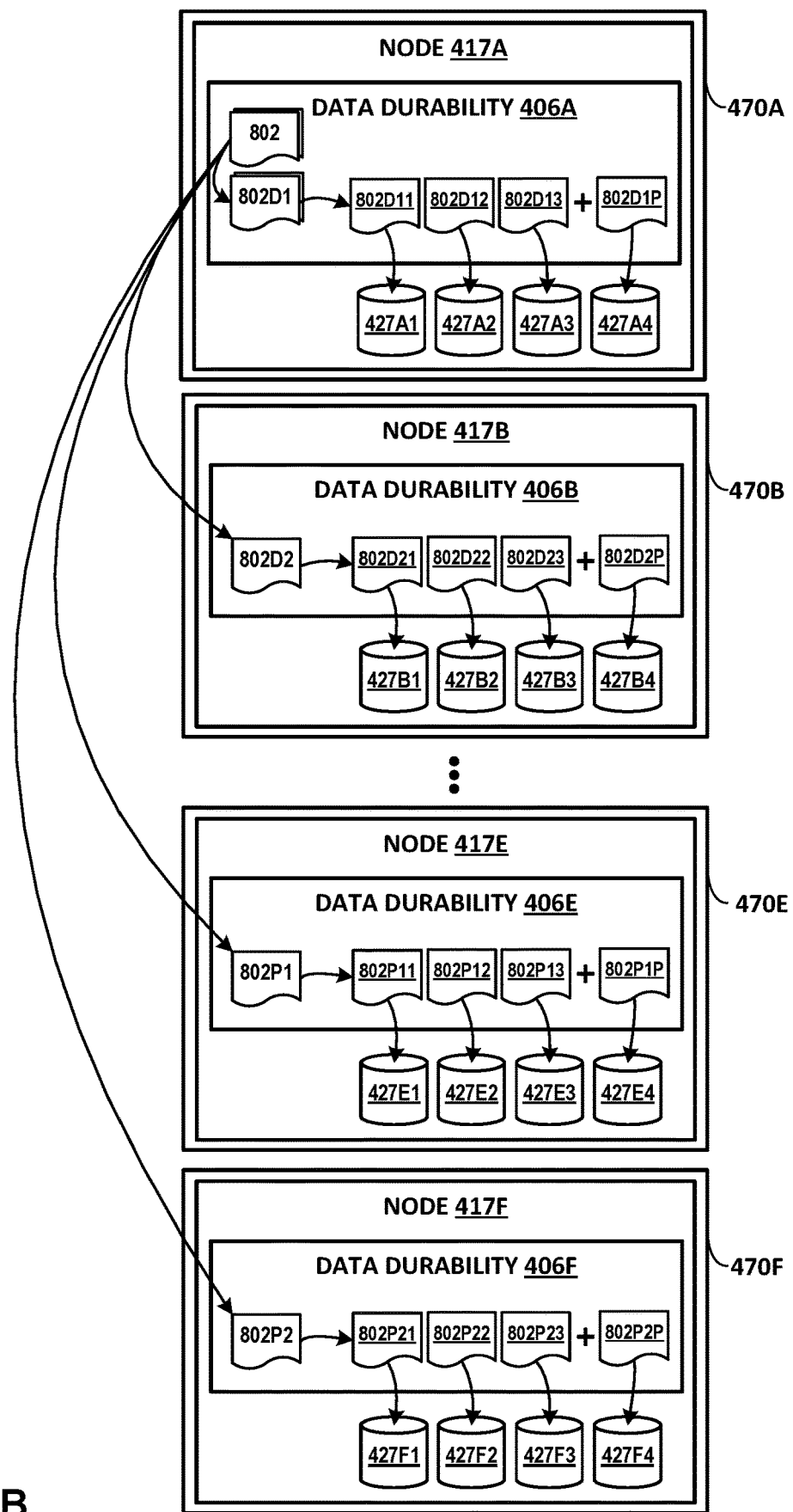

FIG. 4A and FIG. 4B are conceptual diagrams illustrating an example operation in which data is stored within network 108 pursuant to a data reliability scheme, in accordance with one or more aspects of the present disclosure. FIG. 4A illustrates network 108, including a number of racks 470 coupled to each other through switch fabric 114. Specifically illustrated in FIG. 4A are racks 470A through 470H ("racks 470") although any number of racks 470 may be included within network 108. Server 512 is also shown connected directly to switch fabric 114.

Each of racks 470 include one or more nodes 417 and may include one or more servers 412. Rack 470A is illustrated in FIG. 4A showing devices and components included within the rack. Other racks 470B through 470H may be implemented similarly. For ease of illustration in FIG. 4A, one node 417A is shown included within rack 470A, although many more nodes 417 may be included within rack 470A and generally, within each of racks 470. In the example shown, servers 412A through 412N are included within rack 470A, although some racks might not include servers 412 (e.g., such as racks 70-2 and 70-3 of FIG. 1). In general, each of racks 470 may include any number of nodes 417 and any number of servers 412, each of which may be configured and/or may operate in a manner similar to node 417A and server 412A as described herein.

In the example of FIG. 4A, each of racks 470 may correspond to rack 70-2 of FIG. 1, and each of nodes 417 may correspond to one of nodes 17. Each of racks 70 may include multiple logical racks, each made of up multiple logical groupings of nodes 17. For example, in FIG. 4A, rack 470A includes node 417A, which may correspond to one of nodes 17 of rack 70-2 of FIG. 1. In some examples, each of nodes 417 within racks 470 may correspond to data processing unit 217 described in connection with FIG. 2. Also, each of nodes 417 may alternatively correspond to data processing unit 317 described in connection with FIG. 3.

In FIG. 4A, each of nodes 417 may include one or more data durability modules 406, one or more non-volatile memory devices 408, and one or more storage devices 427. As illustrated in FIG. 4A, for example, node 417A includes data durability module 406A, non-volatile memory 408A, and storage devices 427A1 through 427AN ("storage devices 427A," representing any number of storage devices). Data durability module 406A may correspond to one or more of accelerators 146 of FIG. 2, and may be implemented as a data reliability accelerator, although other implementations are possible and are within the scope of this disclosure. Non-volatile memory 408A may be implemented through a solid state drive or random access memory having a battery backup or NVDIMM. Each of storage devices 427A may be implemented through spinning platter hard drives or through other types of storage devices. Storage devices 427A in FIG. 4A may correspond to or may be similar to one or more of storage devices 27 of FIG. 1 or storage devices 227 of FIG. 2. Although in the example of FIG. 4A each of storage devices 427A are illustrated as being included within node 417A, in other examples, one or more of storage devices 427A may be located outside of nodes 417A.

FIG. 4A and FIG. 4B (and in general, other illustrations herein) are described in the context of an erasure coding approach to data durability. Erasure coding is a method of data protection in which data is broken into fragments, expanded and encoded with redundant data pieces. Erasure codes enable data fragments that become corrupted at some point in the storage process to be reconstructed by using information about the data that is stored elsewhere. If some combination of one or more of the data fragments are erased or are otherwise unavailable, but the remaining data blocks are available, the erased or unavailable data blocks can be reconstructed from the available blocks.

Typically, an erasure coding algorithm splits data blocks into "d" data blocks and "p" parity blocks. A Reed Solomon 4+2 erasure coding scheme, for example, uses d=4 data blocks to generate p=2 parity blocks. Many other Reed Solomon implementations are possible, including 12+3, 10+4, 8+2, and 6+3 schemes. Other types of erasure encoding schemes beyond Reed Solomon schemes include parity array codes (e.g., EvenOdd codes, X codes, HoVer codes, WEAVER codes), Low Density Parity Check (LDPC) codes, or Local Reconstruction Codes (LRC). In some cases, such as for parity array codes, reliability schemes may be more restrictive in terms of an ability to recover from failure for a given set of unavailable data fragments or data blocks. Further, data recovery for parity array codes may be iterative if more than one data fragment or data block is unavailable; such iterative data recovery may involve time-consuming and/or inefficient processing, thereby leading to latency and/or poor performance.

Examples described herein principally are described in the context of a 4+2 erasure coding scheme. In such a scheme, two erasure coding data blocks or parity blocks storing Reed Solomon codes are used for every four blocks of data, as described herein. Although various examples herein are principally described in the context of a 4+2 erasure coding scheme, techniques described herein are applicable to other erasure coding or Reed Solomon formulations beyond the 4+2 scheme described in various examples herein. Further, although principally described with respect to Reed Solomon erasure coding scheme, techniques described herein may be applicable to replication, various RAID variants, or other erasure coding schemes. Such RAID variants may include RAID-5, RAID-6, RAID RDP (row-diagonal parity), RAID TP (triple parity), RAID 3D, and others.

In FIG. 4A, and in accordance with one or more aspects of the present disclosure, node 417A may store data 801 within non-volatile memory 408A. For instance, in an example that can be described with reference to FIG. 4A, node 417A begins receiving data 801 from one or more servers included within network 108, such as server 512 or any of servers 412 within rack 470A. In some examples, such servers sending the data may correspond to any of servers 12 illustrated in FIG. 1, including servers within rack 70-1 or servers 12 coupled directly to switch fabric 114 (i.e., those not shown as included within any rack 70 of FIG. 1). In the example illustrated, data 801 is received from server 412A included within rack 470A, although the data might typically be received over the switch fabric 114 from server 512 or from another device or system.

In some examples, data 801 may be received by node 417A as a series of segments of data 801. In such an example, node 417A outputs each segment of data 801 to data durability module 406A. Data durability module 406A stores each segment within non-volatile memory 408A. In some examples, data durability module 406A may compress each segment of data 801 before storing the segment within non-volatile memory 408A. Once each segment of data 801 is stored within non-volatile memory 408A, data durability module 406A may acknowledge the write operation, thereby enabling the device sending that segment of data 801 (e.g., server 412A or server 512) to release or reallocate storage that previously held the segment.

Node 417A may accumulate data within non-volatile memory 408A before writing the data across network 108. For instance, continuing with the example being described with reference to FIG. 4A, node 417A determines, based on a command accompanying data 801 or otherwise, that data 801 is to be stored within network 108. Before writing data 801 across network 108, however, data durability module 406A continues to store segments of data 801 to non-volatile memory 408A (see also memory 139 of FIG. 2) until a sufficient amount of data is received. In some examples, such as in a 4+2 erasure coding scheme, a sufficient amount of data may correspond to 4D bytes, where "D" is an appropriate amount of bytes for implementing the storage system illustrated in FIG. 4A. By accumulating a threshold amount of data (e.g., "D") before initiating a write operation to nodes 417 across network 108, read-modify-write operations tend to be eliminated or at least reduced as described and illustrated herein. Storage system performance may be enhanced or may be more efficient if excessive read-modify-write operations within each of nodes 417 are avoided.

Node 417A may prepare data 801 for storage across network 108. For instance, still continuing with the example being described with reference to FIG. 4A, and once data durability module 406A has stored 4D bytes within non-volatile memory 408A, data durability module 406A splits data 801. Specifically, data durability module 406A splits data 801 into data fragment 802D1, data fragment 802D2, data fragment 802D3, and data fragment 802D4 ("data fragments 802D"). In some examples, each of data fragment 802D1, data fragment 802D2, data fragment 802D3, and data fragment 802D4 may be of equal size, and all of size D (or approximately size D). Data durability module 406A calculates, pursuant to an appropriate data durability algorithm, data fragment 802P1 and data fragment 802P2 ("parity fragments" or "data fragments 802P"). Specifically, data durability module 406A calculates each of data fragment 802P1 and data fragment 802P2 pursuant to an appropriate 4+2 erasure coding scheme. In the example being described, data fragments 802D1 to 802D4 and data fragments 802P1 to 802P2 (collectively, "data fragments 802") represent a 4+2 erasure coding of data 801.

Node 417A may send data fragments 802 across network 108 for storage. For instance, still continuing with the example being described with reference to FIG. 4A, data durability module 406 identifies five other nodes 417 within network 108. To identify the other nodes 417, data durability module 406A may choose randomly, or may choose based on an algorithm designed to efficiently allocate storage across nodes 417. Data durability module 406A sends, to each of the other identified nodes 417, one of the data fragments across switch fabric 114. As illustrated in FIG. 4A, node 417A sends data 801D2 to one of nodes 417 included within rack 470B (using switch fabric 114). Data durability module 406A of node 417A also sends data 801D3, across switch fabric 114, to one of nodes 417 included within rack 470C, and data 801D4 to one of nodes 417 included within rack 470D. Similarly, data durability module 406A of node 417A sends data fragment 802P1 to one of nodes 417 within rack 470E and data fragment 802P2 to one of nodes 417 within rack 470F. Data durability module 406A stores data fragment 802D1 within node 417A (e.g., within storage devices 427). Thus, in the example described in connection with FIG. 4A, node 417A retains data fragment 802D1, although in other examples, node 417A may send data fragment 802D1 to a different node 417 within a different rack 470. Data durability module 406A maintains a record of the location of each of data fragments 802 (node, drive, offset in the drive), and node 417 may use this information to satisfy future read requests.

In the example of FIG. 4A, each of racks 470 may be considered an independent failure domain. Accordingly, data durability module 406A of node 417A seeks to store each of data fragments 802 within a different rack 470. In other examples, however, it may be desirable, necessary, or otherwise appropriate for some of data fragments 802 to be stored within the same rack 470, or even within the same node 417.

In some examples, the storage system illustrated in FIG. 4A may expose storage availability as volumes. For instance, writes by a host device connected to switch fabric 114 may be directed to a "master" node for a respective volume. Once the master node stores the data sought to be stored by a host device in a sufficiently reliable way, the master node may acknowledge the write operation to the host device. In some examples, storing the data in a sufficiently reliable way may involve storing the data within non-volatile memory 408 with adequate redundancy, which may involve storing the data within non-volatile memory 408 across multiple nodes 417. Acknowledging the write operation may, in some examples, take place before each of data fragments 802 is securely written across network 108 pursuant to an appropriate erasure coding or other data reliability scheme. The process by which node 417A writes data fragments 802 across network 108 to other nodes 417 within network 108 may be referred to herein as a "flush" operation by node 417A, where node 417A serves as a master node.

The erasure coding scheme illustrated in FIG. 4A involves relatively low storage costs, since only a relatively small amount of storage overhead is required (in the example of FIG. 4A, the additional storage overhead is 2/4 or 50%). Further, the system of FIG. 4A will tolerate more than the loss of one data fragment. For example, a Reed Solomon 4+2 erasure coding scheme generates two parity blocks (p=2) for each set of four data blocks (d=4). And in general, such an erasure coding scheme can correct a number of erasures less than or equal to "p." So for the 4+2 system of FIG. 4A, the loss or unavailability of any two of data fragments (any combination of data fragments 802) still enables data 801 to be fully recovered by decoding the remaining data fragments. Unavailability of any three data fragments, however, may result in data loss, without further data durability measures. Similarly, for a 12+3 Reed Solomon system, unavailability of any three data or parity fragments still enables the original data to be reconstructed from the remaining fragments, but unavailability of four or more fragments may result in data loss (again, without further data durability measures).

One of the drawbacks of erasure coding systems is complexity, and encoding and decoding data using an erasure coding scheme may require high computing resources, complexity, and/or costs. For example, a Reed Solomon erasure coding scheme is typically implemented using Galois Field mathematics, and many current processors are not well equipped to perform Galois Field mathematics operations efficiently. Complexity, computing resources, and/or inefficiency may affect performance, and/or increase latency of operations on network 108. To address these issues, data durability modules 406 may be configured and/or equipped, in some examples, to process Galois Field mathematical operations efficiently, and may include specialized circuitry or logic that enables efficient performance of operations involved in encoding and/or decoding Reed Solomon erasure codes. In examples where a server (e.g., server 412A of FIG. 4A) is connected to a node having such capabilities (e.g., node 417A of FIG. 4A), one or more of servers 412 may effectively offload, to one or more of nodes 417 (or to data durability modules 406), some or all of the computing operations that might otherwise be performed by one or more of servers 412 to implement an erasure coding system. By offloading the performance of such operations to nodes 417 in such an example, each of servers 412 may operate more efficiently. In some examples, nodes 417 may perform data durability operations (data encoding, data decoding, and recovery) as a transparent process on network traffic (e.g., transparent to cores 140 of FIG. 2).

FIG. 4B illustrates example operations performed by each of racks 470 implementing additional, or second-level data durability measures in the example of FIG. 4A. FIG. 4B illustrates example nodes 417 included within each of racks 470A through 470F. Specifically, FIG. 4B depicts node 417A within rack 470A, which corresponds to node 417A within of rack 470A of FIG. 4A. In addition, FIG. 4B shows an example node 417B within rack 470B, an example node 417E within rack 470E, and an example node 417F within rack 470B. Similar nodes 417 are included within rack 470C and rack 470D, but for ease of illustration, such nodes 417 are not shown in FIG. 4B. Each of racks 470 within FIG. 4B may have many nodes 417, but again, for ease of illustration, only one node 417 is shown within each of racks 470A, 470B, 470E, and 470F.

Included within each of nodes 417 illustrated in FIG. 4B are a number of storage devices. For example, node 417A includes storage devices 427A1 through storage devices 427A4 ("storage devices 427A"). Similarly, each of nodes 417B through 417F are illustrated as including four storage devices 427. Although four storage devices 427 are shown within each of nodes 417 in FIG. 4B, any number of storage devices 427 may be used, depending on the specific data reliability algorithm being implemented within nodes 417.

In FIG. 4B, and in accordance with one or more aspects of the present disclosure, each of nodes 417 may receive a different one of data fragments 802 from node 417A. For instance, in an example that can be described in the context of FIG. 4A and FIG. 4B, and as described in connection with FIG. 4A, node 417A generates data fragments 802 from data 801. Node 417A outputs each data fragment within data fragment 802 to a different one of nodes 417. Specifically, node 417A sends, over switch fabric 114, data fragment 802D2 to node 417B of rack 470B, data fragment 802P1 to node 417E of rack 470E, and data fragment 802P2 to node 417F of rack 470F. And although not specifically shown in FIG. 4B, node 417A sends data fragment 802D3 over switch fabric 114 to one of nodes 417 within rack 470C and sends data fragment 802D4 over switch fabric 114 to one of nodes 417 within rack 470D.

Node 417A may employ a parity scheme to store data fragment 802D1 within rack 470A. For instance, continuing with the example being described in the context of FIG. 4B, data durability module 406A shards data fragment 802D1 into three smaller segments or "secondary data fragments" (i.e., data fragments 802D11, 802D12, and 802D13), each having a size that is equal to or approximately equal to D/3 (where the size of each of data fragments 802 is D or approximately D). Data durability module 406A uses each of these three secondary data fragments to compute a parity block, shown in FIG. 4B as data fragment 802D1P. Secondary data fragment 802D1P is constructed to include information sufficient to enable any one of data fragments 802D11 through 802D13 to be recovered, if such data is lost or corrupted. In some examples, secondary data fragment 802D1P may be calculated through exclusive or operation performed on data fragments 802D11, 802D12, and 802D13 (e.g., 802D11 XOR 802D12 XOR 802D13). In the example being described, secondary data fragment 802D1P also has a size of D/3 (or approximately D/3). Data durability module 406A stores each of secondary data fragments 802D11, 802D12, 802D13, and 802D1P in a different one of storage devices 427A as illustrated in FIG. 4B. In some examples, if any of one of storage devices 427A fail, then the data stored on the failed storage device 427A can be constructed from the data from the other three storage devices 427A, due to the redundancy provided by secondary data fragment 802D1P. In the example being described, however, if more than one of storage devices 427A fails at the same time, node 417A might not be able to recover the lost data.

In a similar manner, node 417B may employ a parity scheme (e.g., a RAID or erasure coding scheme) to store data fragment 802D2 within rack 470B. For instance, again with reference to the example being described in the context of FIG. 4B, data durability module 406B shards data fragment 802D2 into three smaller secondary data fragments (i.e., data fragments 802D21, 802D22, and 802D23), each having a size that is equal to or approximately equal to D/3. Data durability module 406B computes data fragment 802D1P, and stores each of data fragments 802D21, 802D22, 802D23, and 802D2P in a different one of storage devices 427B as illustrated in FIG. 4B. As in node 417A, the redundancy provided by data fragment 802D2P enables data lost due to a failure of any of one of storage devices 427B to be reconstructed.

Each of node 417E and node 417F may also employ similar parity schemes to store each of data fragment 802P1 and data fragment 802P2 across storage devices 427 within respective nodes 417. For instance, data durability module 406E shards data fragment 802P1 into three smaller segments (data fragments 802P11, 802P12, and 802P13), each having a size that is equal to or approximately equal to D/3. Data durability module 406E computes data fragment 802P1P, and stores each of data fragments 802P11, 802P12, 802P13, and 802P1P in a different one of storage devices 427E as illustrated in FIG. 4B, thereby enabling data recovery should one of storage devices 427E fail. Data durability module 406F performs a similar operation, as illustrated in FIG. 4B.

In the flush operation described in connection with FIG. 4A and FIG. 4B, six nodes 417 are involved, and each of nodes 417 writes D/3 bytes to 4 separate storage devices 427 within each respective node 417. The example described in FIG. 4A and FIG. 4B tends to minimize or reduce read-modify-write operations, since in the example described, a threshold amount of data (e.g., "D" bytes) is accumulated before the flush operation is initiated.

In some examples, choosing which of storage devices 427 within a given node 417 to store a data fragment or a secondary data fragment may be based on a load balancing scheme across each of the storage devices 427 within a given node. Although in the example described in connection with FIG. 4A and FIG. 4B, twenty-four storage devices 427 are involved in the flush operation (6 nodes 417 with 4 storage devices 427S each), in other examples, many more storage devices 427 may be involved. In some examples, for instance, a given node 417 may, during one flush operation, write four data fragments to a first set of storage devices 427, but in a subsequent flush operation, that same node 417 may write data fragments to a second set of four storage devices 427. Writing to multiple storage devices 427 may, in some cases, result in a faster flush operation and/or otherwise reduce latency.

In the scheme described in FIG. 4A and FIG. 4B, including the additional parity procedure described in FIG. 4B, there are 8 erasure coded blocks and 4 parity blocks for every 12 data blocks. Accordingly, the overhead for data protection is on the order of 100%. In some examples, this overhead may be reduced if data durability module 406A shards each of data fragment 802D1, data fragment 802D2, and data fragment 802D3 into a larger number of pieces. For example, if data durability module 406A shards each of data fragment 802D1, data fragment 802D2, and data fragment 802D3 into 6 pieces, rather than 3, the overhead is reduced to 75% (12 erasure coded blocks and 4 parity blocks for every 24 blocks of data).

Note that the parity scheme employed by each of nodes 417 to store data fragments 802 across storage devices 427 within each node 417 provides additional protection against data loss. A standard 4+2 erasure coding scheme can protect only against the failure of one or more drives in each of 2 different nodes. However, without further data reliability measures, a storage system employing a 4+2 scheme cannot recover data if there is an additional drive or node failure in a third node. As further described herein, however (see, e.g., FIG. 7), the system described in connection with FIG. 4B may be able to protect against drive failures in all 6 nodes by using the parity scheme described in FIG. 4B when storing each of secondary data fragments 802. In a 4+2 erasure coding scheme, up-to 12 drive failures may be tolerated in some cases (e.g., 2 nodes with all drives failed) and other 4 nodes with 1 drive failed.

Figure 5:
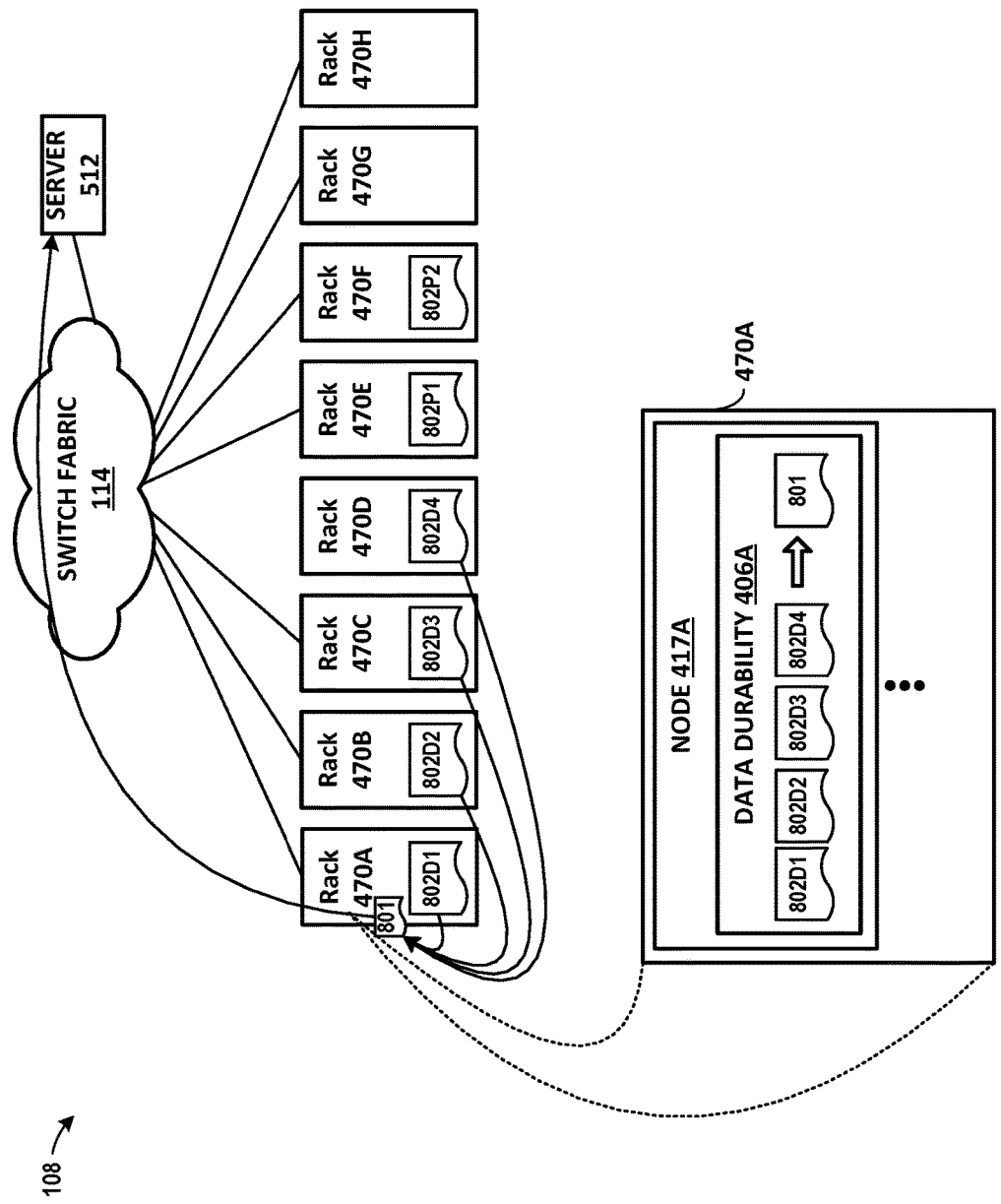
FIG. 5 is a block diagram illustrating example operations on a network in which stored data fragments are read from locations on the network, in accordance with one or more aspects of the present disclosure.

FIG. 5 is a block diagram illustrating example operations on a network in which stored data fragments are read from locations on the network, in accordance with one or more aspects of the present disclosure. In the example of FIG. 5, it is assumed that node 417A has previously applied a 4+2 erasure coding algorithm to split data 801 into four data fragments 802D, generated two data fragments 802P, and stored each of data fragments 802D and data fragments 802P across network 108 in the manner illustrated in FIG. 4A. Specifically, each of data fragment 802D1, data fragment 802D2, data fragment 802D3, data fragment 802D4, data fragment 802P1, and data fragment 802P2 have been stored at racks 470A to 470F, respectively.

In FIG. 5, and in accordance with one or more aspects of the present disclosure, node 417A may perform a read operation and retrieve some portion of data 802 stored as data fragments 802D. For instance, in an example that can be described in the context of FIG. 5, node 417A receives a request for data 801. In some examples, node 417A receives the request from a server 512 over switch fabric 114. Node 417A outputs information about the request to data durability module 406A. Data durability module 406A may access a directory, stored within node 417A or elsewhere, identifying where each of data fragments 802 are stored. Data durability module 406A identifies which of data fragments 802 are needed to fulfil the request from server 512. Data durability module 406A determines that each of the needed data fragments 802D are available. In some examples, only a subset, or even a single one of the data fragments is needed to fulfill the request from server 512, since only a portion of the data 802 is needed by server 512. In some situations, perhaps most situations, only a portion of one of the data fragments 802D is needed. Since each of data fragments 802D are available, data durability module 406A does not need to access any of data fragments 802P. Data durability module 406A accesses and/or retrieves one or more of data fragments 802D1, 802D2, 802D3, and 802D4 over switch fabric 114 within network 108 as illustrated in FIG. 5. Note that if the data requested is included within data fragment 802D1, module 406A might not have to access the network at all. Also, in some cases, only a subset of fragment 802D1 might have to be accessed, rather than the entire fragment 802D1.

In some examples, node 417A may reconstruct data 801 if the request by server 512 requires a significant portion or all of the data 801. For instance, in another example that can be described in the context of FIG. 5, data durability module 406A determines that to fulfill the request from server 512, all of data fragments 802D are needed. Data durability module 406A reconstructs data 801 by retrieving each of data fragment 802D1, data fragment 802D2, data fragment 802D3, and data fragment 802D4 and combining them. In some examples, data durability module 406A may be able to reassemble data 801 by simply stitching each of data fragments 802D together to form data 801, without having to perform decoding operations pursuant to the data durability scheme implemented to store data fragments 802. Node 417A responds to the request for data 801 by outputting, over switch fabric 114 to server 512, the requested portion of the reassembled data 801. In another example, parts of data fragments 802D3 and 802D4 may be needed, and in such an example, module 406A may read only the parts of fragments 802D3 and 802D4 that are needed, and then send the combined result.

Figure 6A:
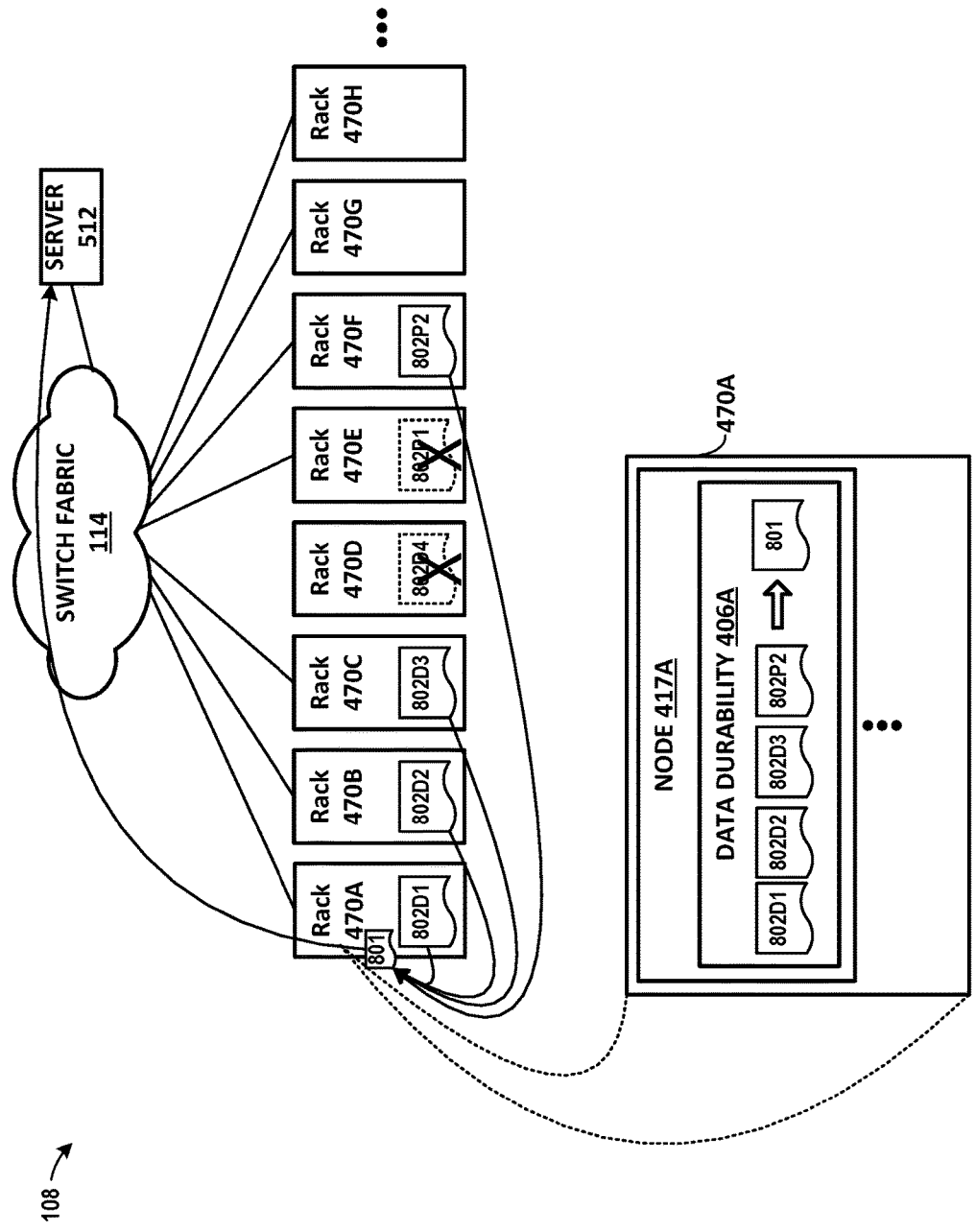
FIG. 6A is a block diagram illustrating an example read operation on a network in which some data fragments stored on the network are unavailable, in accordance with one or more aspects of the present disclosure.

FIG. 6A is a block diagram illustrating an example read operation on a network in which some data fragments stored on the network are unavailable, in accordance with one or more aspects of the present disclosure. As in FIG. 5, it is assumed that node 417A has split data 801 into four data fragments 802D, has generated two data fragments 802P, and has stored each of data fragments 802D and data fragments 802P across network 108 in the manner illustrated in FIG. 6A. However, due to a hardware or software error, or due to some other reason, data fragment 802D4 stored at rack 470D is not available, and further, data fragment 802P1 stored at rack 470E is not available.

In FIG. 6A, and in accordance with one or more aspects of the present disclosure, node 417A may service a request for data from server 512. For instance, in an example that can be described in the context of FIG. 6A, node 417A receives, over switch fabric 114 and from server 512, a request for data. Node 417A outputs the request to data durability module 406A. Data durability module 406A determines that the request is for some portion of data 801. Data durability module 406A accesses a directory, stored within node 417A or elsewhere, identifying where each of data fragments 802 are stored. In some examples, data durability module 406A determines that the request is for a small portion of data 801, requiring access to only one of the fragments 802. In such an example, data durability module may determine that the required fragment is available, and therefore accesses the required fragment, extracts the requested data, and responds to the request by sending the requested data over switch fabric 114 to server 512.

In some examples, data durability module 406A may determine that the required fragment is not available, or that the requested data is for a significant part of or all of data 801. For instance, in the example of FIG. 6A, data durability module 406A determines that data fragments 802D1, 802D2, and 802D3 are available, but that data fragment 802D4, stored at rack 470D, is not available. Data durability module 406A further determines that data fragment 802P1 is not available, but that data fragment 802P2 is available. Data durability module 406A determines that the request by server 512 requires one of the fragments that is not available but that a sufficient number of data fragments are available to reconstruct data 801.

Node 417A may reconstruct data 801. For instance, continuing with the example being described in the context of FIG. 6A, data durability module 406A accesses and/or retrieves data fragments 802D1, 802D2, 802D3, and 802P2 over switch fabric 114 within network 108. Data durability module 406A reconstructs data 801 from the retrieved data fragments. In some examples, data durability module 406A performs erasure decoding operations (e.g., a Reed Solomon 4+2 decode operation) to reconstruct data 801. Node 417A responds to the request for data 801 by outputting the requested portion of reconstructed data 801 over switch fabric 114 to server 512.

Figure 6B:
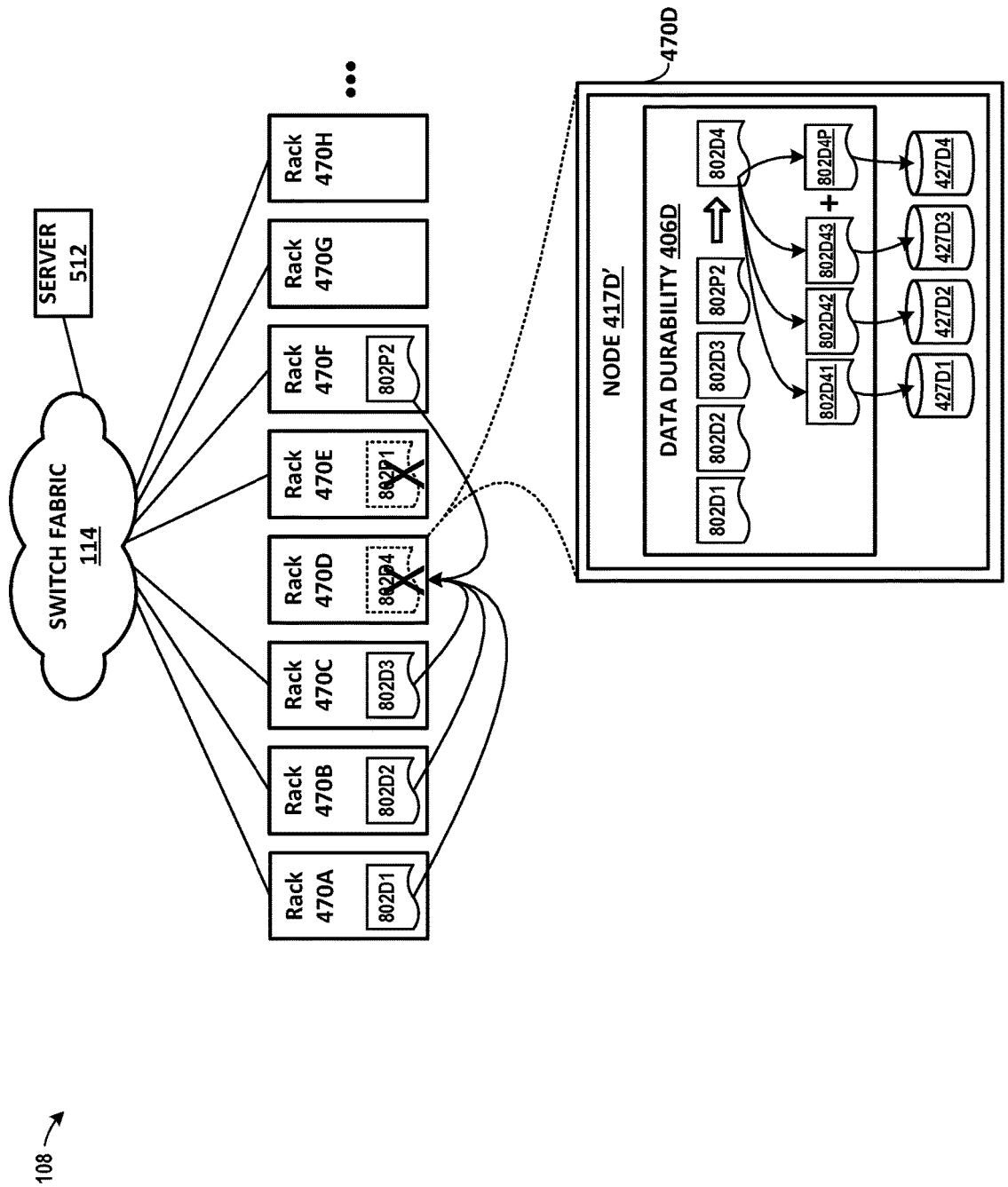
FIG. 6B is a block diagram illustrating an example of how a failed node recovers lost data, in accordance with one or more aspects of the present disclosure.

FIG. 6B is a block diagram illustrating an example of how a failed node recovers lost data, in accordance with one or more aspects of the present disclosure. As in prior figures, data 801 has been split into data fragments 802D and data fragments 802P, and each of data fragments 802 have been stored across network 108 as illustrated in FIG. 6B. As shown in FIG. 6B, node 417D within rack 470D includes data durability module 406D. Node 417D also includes a series of storage devices, including storage devices 427D1, 427D2, 427D3, and 427D4 ("storage devices 427D").

In FIG. 6B, as in FIG. 6A, data fragment 802D4 stored within node 417D of rack 470D is not available. Data fragment 802D4 may be unavailable due to a number of reasons, including a software or hardware failure (e.g., failure of a processor within nodes 417D), or due to a maintenance event or otherwise. However, in the example of FIG. 6B, node 417D has failed such that all of the data stored at node 417D or across storage devices 427D has been lost or corrupted.

In FIG. 6B, and in accordance with one or more aspects of the present disclosure, rack 470D may identify and remedy the failure of node 417D. For instance, in an example that can be described in the context of FIG. 6B, rack 470D determines that node 417D has failed. Rack 470D may make such a determination through routine diagnostic testing, as a result of an error condition, or otherwise. Rack 470D or another system automatically provisions a new node 417D ("node 417D'"). In other examples, rack 470D (or another system) provisions a new node 417D' in response to administrator input. In some examples, rather than rack 470D provisioning node 417D', an administrator repairs or replaces node 417D.

Once online, new node 417D' may reconstruct data fragment 802D4. For instance, referring again to the example being described in the context of FIG. 6B, data durability module 406D of node 417D' retrieves, over switch fabric 114, a subset of data fragments 802 stored across network 108. Specifically, data durability module 406D retrieves data fragments 802D1, 802D2, 802D3, and 802P2. Data durability module 406D uses erasure coding techniques appropriate for the erasure coding scheme employed across racks 470 to assemble data fragment 802D4.

New node 417D' may reconstruct data previously stored across storage devices 427D. For instance, still referring to the example being described in the context of FIG. 6B, data durability module 406D splits data fragment 802D4 into secondary data fragments 802D41, 802D42, and 802D43. Each of these secondary data fragments are equal sized (e.g., D/3) or approximately equal sized. Data durability module 406D generates secondary data fragment 802D4P as a parity block that can be used to reconstruct any of data fragments 802D41, 802D42, or 802D43 if any one of such data fragments is lost. Data durability module 406D stores each of data fragments 802D41, 802D42, 802D43, and 802D4P in a separate one of storage devices 427D as illustrated in FIG. 6B. Once each of those data fragments are stored within storage devices 427D, the data previously stored at node 417D has been reconstructed. In some examples, only data from fragment 802D4 is reconstructed. Many other fragments may be lost when a node goes down, and a separate full rebuild might be needed run to reconstruct all the lost data. In some examples, such a rebuild operation may be performed as a background process. In the example being described, it may be that only the data that is requested as part of the read is reconstructed. In general, when a node fails, a full data rebuild process is invoked, independent of any read requests. In general, the term "reconstruct" may describe operations involving data being reconstructed during a read request, but the term "rebuild" may more appropriately describe reconstructions of data that are invoked independently from any read request to restore all the data.

Figure 6C:
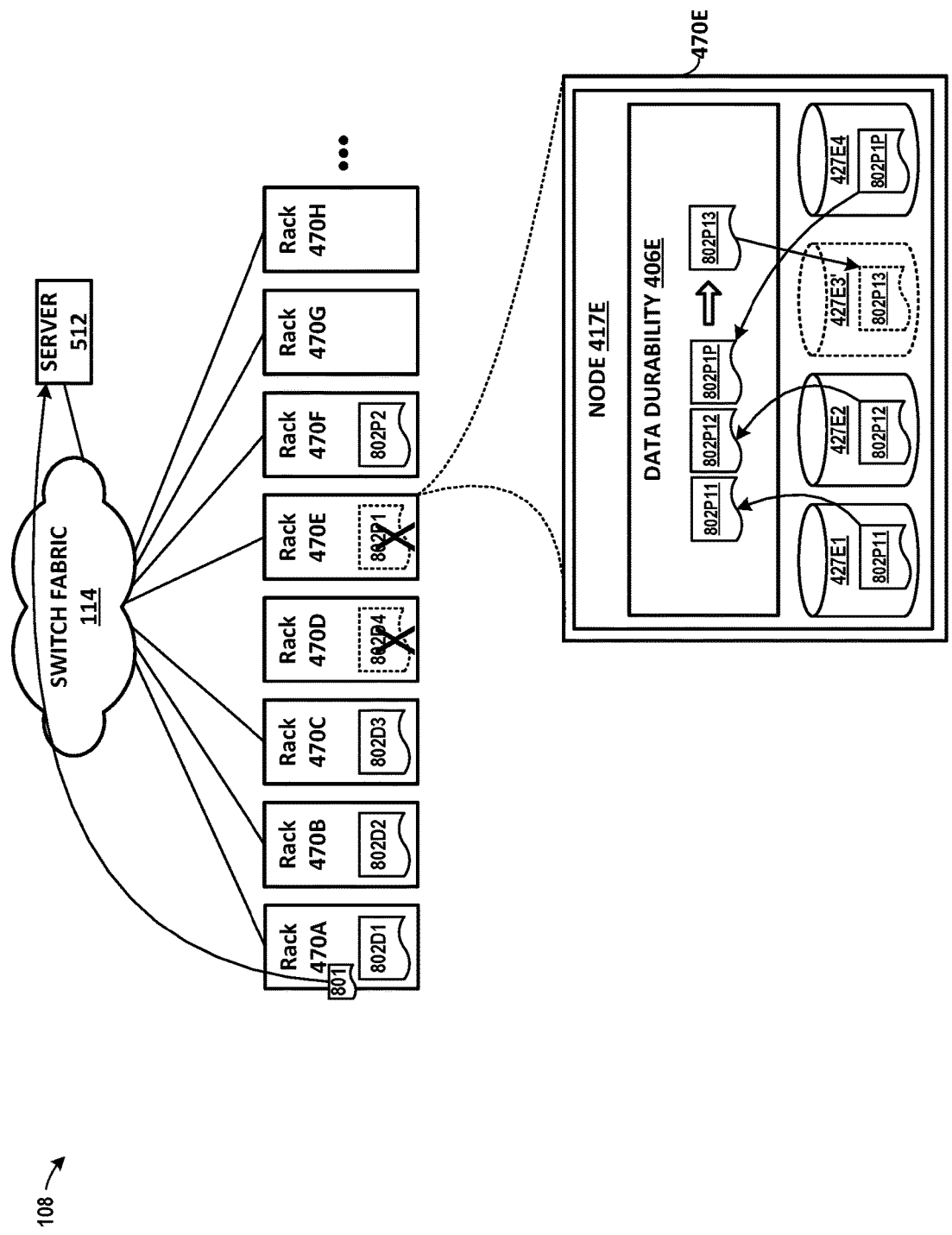
FIG. 6C is a block diagram illustrating another example of how a failed node recovers lost data, in accordance with one or more aspects of the present disclosure.

FIG. 6C is a block diagram illustrating another example of how a failed node recovers lost data, in accordance with one or more aspects of the present disclosure. As in prior figures, data fragments 802 have been stored across network 108 as illustrated in FIG. 6C. Node 417E within rack 470E is shown and includes data durability module 406E. Node 417E also includes a series of storage devices, including storage devices 427E1, 427E2, 427E3, and 427E4 ("storage devices 427E").

In FIG. 6C, data fragment 802P1 stored within node 417E of rack 470E is not available. Specifically, in the example of FIG. 6C, data fragment 802P1 is unavailable due to a failure of storage device 427E3 within node 417E. Node 417E remains operational, and each of storage devices 427E1, 427E2, and 427E4 remain operational.

In FIG. 6C, and in accordance with one or more aspects of the present disclosure, rack 470E may identify and remedy the failure of storage device 427E3 within node 417E. For instance, in an example that can be described in the context of FIG. 6C, rack 470E, node 417E, and/or data durability module 406E (or another component or system) determines that storage device 427E3 has failed. Rack 470E (or another system) further determines that each of the remaining storage devices 427E are operational. Rack 470E (or another system or an administrator) provisions a new storage device 427E3 (i.e., storage device 427E3'). In some examples, new storage provisioning may be unnecessary where there is enough free space collectively across the surviving storage devices or drives to reconstruct the data.

Once storage device 427E3' is deployed and operational, node 417E may reconstruct data fragment 802P13. For instance, referring again to the example being described in the context of FIG. 6C, data durability module 406E uses data fragments 802P11, 802P12, and 802P1P (stored at storage devices 427E1, 427E2, and 427E4, respectively) to reconstruct data fragment 802P13. Data durability module 406E stores reconstructed data fragment 802P13 at storage device 427E3'. Once data fragment 802P13 is stored at storage device 427E3', the data previously stored at node 417E has been reconstructed. In some examples, note that only the data requested by the read operation is reconstructed. Typically, node 417E, or another node or system, would detect a need for rebuilding the data that used to be stored on the failed drive, and would initiate a full rebuild of all the data that used to be on the failed drive, independent of any pending read request.

One drawback of scale-up storage systems, where node or drive failures are handled by rebuilding data by retrieving data from other nodes, is that recovering from a failure tends to increase network traffic. For example, for a given failed node 417, such as that described and illustrated in connection with FIG. 6B, data from other nodes 417 are retrieved over switch fabric 114 in order to rebuild the data previously stored at the failed node. This rebuilding process consumes significant network capacity, and may lead to a reduction in the amount of network capacity available for productive uses.

However, in the example of a single failed storage device 427 on a given node, such as that described and illustrated in connection with FIG. 6C, little or no network traffic is needed to reconstruct the failed drive (i.e., storage device 427E3 in FIG. 6C). Accordingly, if failures in network 108 are limited to drive failures in the system of FIG. 6C, many data reconstruction operations can be handled without any significant increase in traffic on network 108. And in practice, failures of storage devices 427 tend to be much more frequent than failures of nodes 417. For example, failure rates for nodes 417 may be 0.2% per year, whereas failure rates for storage devices 427 may be 2%-4% per year or 10-20 times higher. Accordingly, the capability to recover from a failure of one or more of storage devices 427 without incurring additional network traffic is a significant advantage.

Further, in cases in which data can be recovered and rebuilt without requiring network traffic (e.g., as in FIG. 6C), rebuild times tend to be faster than recovery operations in which data is reconstructed from erasure coded blocks of data retrieved over network 108 (e.g., as in FIG. 6B). Still further, a scheme that enables any give node 417 to recover from a single drive failure may enable network 108 to recover from a simultaneous failure of one drive in each of nodes 417 within network 108. Further yet, even with a simultaneous failure of one drive in each of nodes 417 in network 108, little or no additional network traffic may be required in rebuilding the lost data.

Figure 7:
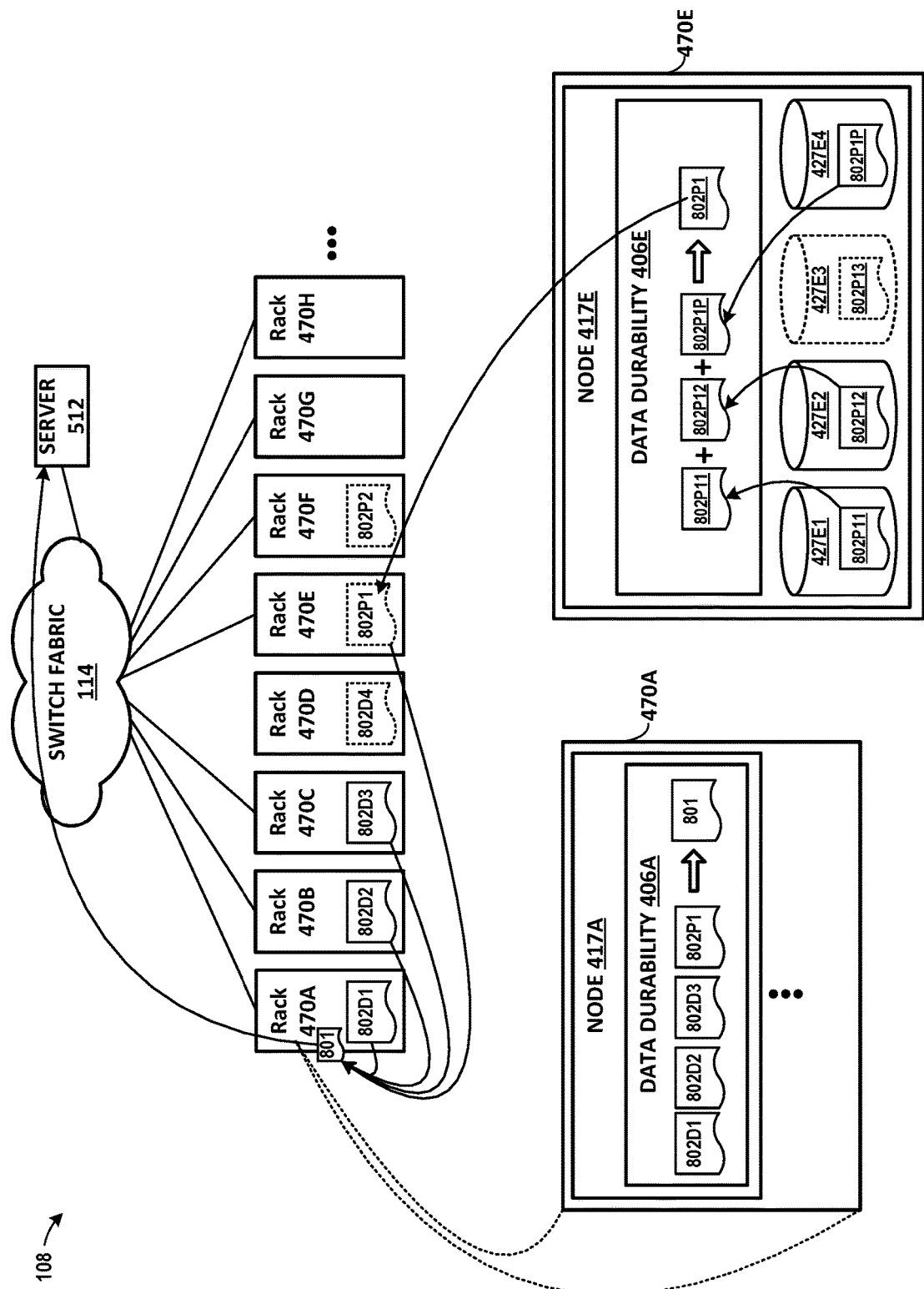
FIG. 7 is a block diagram illustrating an example read operation on a network in which data is recovered using an enhanced 4+2 erasure coding scheme, in accordance with one or more aspects of the present disclosure.

FIG. 7 is a block diagram illustrating an example read operation on a network in which data is successfully recovered using an enhanced 4+2 erasure coding scheme, in accordance with one or more aspects of the present disclosure. In FIG. 7, and similar to previously described illustrations, node 417A has split data 801 into four data fragments 802D, has generated two data fragments 802P, and has stored each of data fragments 802D and data fragments 802P across network 108 as illustrated in FIG. 7. Due to a hardware or software error, or due to some other reason, three of data fragments 802 are not available in the example of FIG. 7. Specifically, data fragment 802D4 stored at rack 470D is not available, data fragment 802P1 stored at rack 470E is not available, and data fragment 802P2 stored at rack 470F is not available.

In a typical 4+2 erasure coding scheme, network 108 would normally be unable to recover from a loss of three of data fragments 802. However, if one or more of nodes 417 within racks 470 employ the additional parity coding and storage procedures described in connection with FIG. 4B, FIG. 6B, and other illustrations, network 108 may be able to recover the data loss illustrated in FIG. 7. In general, techniques described herein may enable full recovery of data involving a variety of combinations of node failures and/or drive failures (e.g., multiple node failures, multiple drive failures within a single node, or single drive failures across many nodes).

In FIG. 7, and in accordance with one or more aspects of the present disclosure, node 417A may identify which of data fragments 802 are available. For instance, in an example that can be described in the context of FIG. 7, node 417A receives, over switch fabric 114 and from server 512, a request for data. Node 417A outputs the request to data durability module 406A. Data durability module 406A determines that the request is for a large portion or all of data 801. Data durability module 406A accesses a directory, stored within node 417A or elsewhere, identifying where each of data fragments data fragments 802 are stored. Data durability module 406A determines that data fragments 802D1, 802D2, and 802D3 are available, but that none of the other data fragments within data fragments 802 are available.

Node 417E may reconstruct data fragment 802P1. For instance, referring again to the example being described in connection with FIG. 7, data durability module 406A determines that node 417E within rack 470 is responsible for storage of data fragment 802P1. Data durability module 406A communicates with node 417E and determines that node 417E is still working properly. Data durability module 406A communicates with node 417E over switch fabric 114 and requests data fragment 802P1. Data durability module 406E of node 417E receives the request and determines that storage devices 427E1, 427E2, and 427E4 are operating properly, but that storage device 427E3 has failed, so that data fragment 802P13 is not available. Data durability module 406E reconstructs data fragment 802P1 from data fragment 802P11, data fragment 802P12, and data fragment 802P1P. Data durability module 406E outputs, over switch fabric 114 and to node 417A, data fragment 802P1 in response to the request from data durability module 406A of node 417A.

Node 417A may reconstruct data to comply with the request from server 512. For instance, still referring to the example being described in connection with FIG. 7, data durability module 406A accesses data fragment 802D1 (stored within node 417A) and receives, over switch fabric 114, data fragments 802D2, 802D3, and 802P1 (received over switch fabric 114 from rack 470B, rack 470C, and rack 470E, respectively). Data durability module 406A reconstructs data 801 from data fragments 802D1, 802D2, 802D3, and 802P1. Node 417A responds to the request from server 512 by outputting, over switch fabric 114 to server 512, requested portion of reconstructed data 801.

In the example of FIG. 7, network 108 is able to recover from an unavailability of three of data fragments 802 by enabling rack 470E to regenerate data fragment 802P1 from data stored within node 417E in the manner described. In a typical 4+2 erasure coding recovery operation, recovering from three or more of the data fragments being unavailable is not possible. But given the hierarchical data durability coding practices employed in network 108, in which nodes 417 perform a second-level, additional data durability scheme, network 108 is able to recover in a situation in which three 4+2 coded data fragments are unavailable. In the described example, nodes 417 independently protect against the failure of one of storage devices 427 within each of nodes 417. In some examples, network 108 may recover from even more widespread unavailability of erasure-coded data fragments, as long as such failures involve a failure of a single storage device 427 on many of those nodes 417.

Although techniques described and illustrated herein have been primarily described in the context of erasure coding used across nodes 417 and parity used within nodes 417 (e.g., across storage devices 427), other variations are possible. For instance, in other examples, erasure coding may be used across nodes 417 and erasure coding may also be used within nodes 417 (across storage devices 427). In another example, parity coding may be used across nodes 417 and erasure coding may be used within nodes 417 and across storage devices 427. In yet another example, parity may be used both across nodes 417 and within nodes 417. Each of these variations may require different storage space overheads for data protection, and they may also differ in the number of drive failures they can recover from.

Although techniques described and illustrated herein have primarily described flushing operations writing each of four shards from data fragments 802 to one of storage devices 427, other variations for selection of the destination for such shards are possible. In particular, where one or more of nodes 417 have sixteen storage devices 427, at least two possible variations may be considered.

In the first variation, data durability module 406 within a given node 417 may divide the 16 storage devices 427 into 4 pre-selected groups of 4 storage devices 427 each. Data durability module 406 may pick one of the 4 groups to write to, based on the volume whose data is being flushed.

In a second variation, data durability module 406 may, based on the volume whose data is being flushed, pick a set of 4 storage devices 427 from among the 16 storage devices 427. In such an example, there are 1820 ways to choose 4 storage devices 427 out of 16, and each of these combinations can be configured to be equally likely to be picked.

The advantage of the first variation is that up to 4 storage devices 427 can fail per nodes 417, as long as the 4 storage devices 427 are in different groups. In such an example, network 108 may still recover without any network traffic. In the second variation, network 108 may recover from one storage device 427 failure per node without network traffic. However, rebuild is much faster for this second variation, as all the remaining 15 storage devices 427 can be used to complete the rebuild. In the first variation, on the other hand, 3 storage devices 427 are involved in a rebuild, so the rebuild may take longer to complete.

An alternative implementation is also possible relating to how the sharding, parity and erasure coding calculation during a flush operation is performed by a given data durability module 406 of a given node 417. In the scheme primarily described herein, a master node uses data fragments 802D1, 802D2, 802D3, and 802D4 to compute data fragments 802P1 and 802P2. Node 417A then transmits data fragments 802D2, 802D3, 802D4, data fragments 802P1, and 802P2 to 5 other nodes 417 and each of these receiving nodes 417 shard the received information and compute parity on the shards. A variation is to have the master node (e.g., node 417A) shard the data, compute erasure coding on the shards, then send the sharded data and sharded EC to 5 other nodes, where parity is computed on the shards. Specifically, at the master node, data fragment 802D1 is sharded into Data11, Data12 and Data13; data fragment 802D2 into Data21, Data22, Data23; data fragment 802D3 into Data31, Data32 and Data33; and data fragment 802D4 into Data41, Data42, and Data43. EC11 and EC21 is computed by node 417A using Data11, Data21, Data31 and Data41. Similarly, EC12 and EC22 are also computed by node 417A node using Data12, Data22, Data32, and Data42. Finally, EC13 and EC23 are computed by node 417A using Data13, Data23, Data33, and Data43. Node 417 sends the data fragment 802D2 shards, the data fragment 802D3 shards, the data fragment 802D4 shards, the EC1 shards and the EC2 shards to 5 other nodes which compute the respective parities. This variation can have benefits during rebuild, possibly allowing for more parallelism and also allowing for recovery from individual shard failures without reading all the 3 shards.

In some examples, locally decodable erasure codes (LRC) can be used in a manner consistent with techniques described herein. In one such example, parity can be used to recover from storage devices 427 failures and LRC may be used to recover from node failures.

One possible scheme that may be used to avoid network traffic on failures of storage devices 427 is to add a parity drive to each of nodes 417. For example, each of nodes 417 could have 15 storage devices 427 for data and one storage device 427 for parity. When one of storage devices 427 fails, the drive storing parity can be used to recover the failed data drive. However, with this approach, on every flush where 6 nodes write to one drive each, a given node 417 may have to also update the parity drive. This requires a read modify write operation on both the data drive and the parity drive. Each of the 6 writes turns into 4 drive operations (read old data, read old parity, write new data, write new parity), so every flush operation goes from needing 6 drive operations to 24 drive operations. At least some of the techniques described herein avoid this disadvantage.

Figure 8:
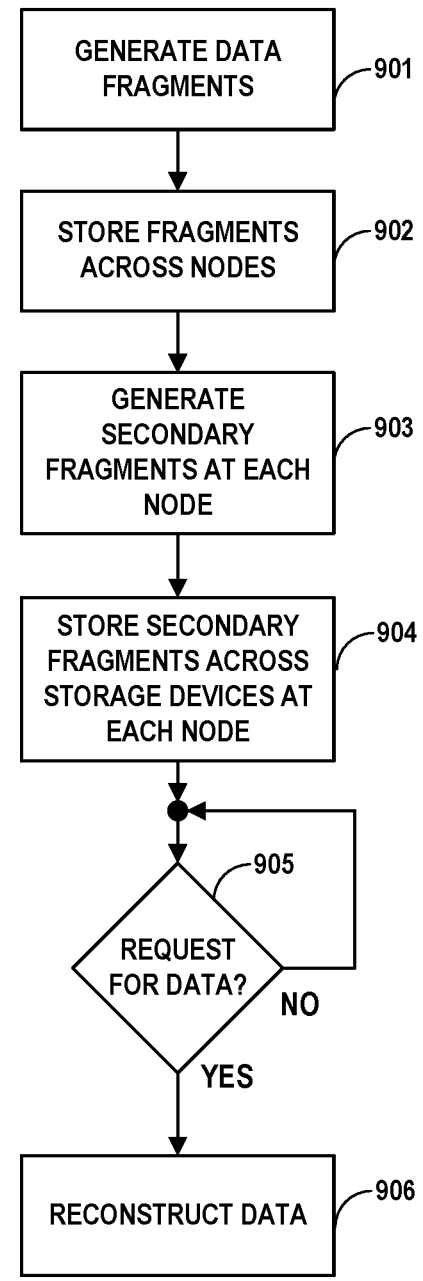
FIG. 8 is a flow diagram illustrating operations performed by an example node in accordance with one or more aspects of the present disclosure.

FIG. 8 is a flow diagram illustrating operations performed by an example node in accordance with one or more aspects of the present disclosure. FIG. 8 is described herein primarily within the context of node 417A of FIG. 4A and FIG. 4B. In other examples, operations described in FIG. 8 may be performed by one or more other components, modules, systems, or devices. Further, in other examples, operations described in connection with FIG. 8 may be merged, performed in a difference sequence, omitted, or may encompass additional operations not specifically illustrated or described.

In the process illustrated in FIG. 8, and in accordance with one or more aspects of the present disclosure, node 417A may generate data fragments 802 (901). For example, with reference to FIG. 4A, node 417A starts receiving a stream of data representing data 801 from a server over switch fabric 114. Node 417A outputs data from data 801 to data durability module 406A. Data durability module 406A accumulates data 801 in non-volatile memory 408A. Data durability module 406A continues to accumulate data 801 as it arrives from many different servers in non-volatile memory 408A until a threshold amount of data (i.e., "D" bytes) is received. In some examples, waiting to accumulate a threshold amount of data may reduce read-modify-write operations. In some examples, data durability module 406A may acknowledge write operations by the data-sending server (e.g., server 512) as data 801 is stored within non-volatile memory 408A. Data durability module 406A splits data 801 into data fragments 802 (e.g., each with a size of D/4). Data durability module 406A also calculates and generates data fragments 802P, as shown in FIG. 4A. In some examples, each of data fragments 802D and data fragments 802 may be of equal size, and all of size D (or approximately size D).

Node 417A may store data fragments 802 across nodes 417 (902). For example, again with reference to FIG. 4A, data durability module 406 identifies five other nodes 417 within network 108. Data durability module 406A sends, to each of the other identified nodes 417, one of the data fragments across switch fabric 114. As illustrated in FIG. 4A, data durability module 406A within node 417A may retain data fragment 802D1, but node 417A sends the remaining data fragments 802D and data fragments 802P to different nodes 417 across network 108. Data durability module 406A logs a record of the location of each of data fragments 802.

Each of nodes 417 may generate secondary data fragments 802 (903). For example, each of nodes 417 that receive one of data fragments 802 shards the respective data fragment 802 into secondary data fragments (e.g., three secondary data fragments or segments for each of data fragments 802). Each of data durability modules 406 within respective nodes 417 also compute a secondary parity data fragment from the other secondary data fragments.

Node 417A may store secondary data fragments 802 across storage devices 427 at each node 417 (904). For example, each of data durability modules 406 store the three secondary data fragments across storage devices 427 included within respective nodes 417 (904). Each of data durability modules 406 also store the parity data fragment in a fourth storage device 427 (see FIG. 4B). In some examples, the parity data fragment allows for recovery from a failure of one storage device 427. In other examples, the parity data fragment may be calculated to recover from failures of more than one storage devices 427. In such an example, the parity data fragment may include multiple data fragments and/or require additional storage.

Node 417A may receive a request for data 801 (YES path from 905). For example, and with reference to FIG. 4A, node 417A receives a request, over switch fabric 114 and from server 512, for some portion of data 801. Node 417A outputs information about the request to data durability module 406A.

Node 417A may, responsive to the request, identify a subset of fragments sufficient to satisfy the request. Node 417 may access such fragment(s) and output the data, over switch fabric 114, to server 512. However, in some examples, node 417A may reconstruct data 801 (906). For example, data durability module 406A may determine that all of the data fragments are needed to fulfill the request from server 512. To respond to the request, data durability module 406A within node 417A accesses and/or retrieves data fragments 802D1, 802D2, 802D3, and 802D4 over switch fabric 114 within network 108. If data durability modules 406A determines that any of data fragments 802D are not available, data durability module 406A accesses one or more of data fragments 802P. In some examples, each of nodes 417 may reconstruct any data fragment 802 that is not available by using the reliability coding incorporated within the data stored within storage devices 427 included in that node 417. In such an example, any such data fragment 802 that is not available may be recovered using data internal to that node 417, and without incurring additional network traffic to retrieve one or more of data fragments 802 from other nodes 417.

In some examples, perhaps most examples, write and read requests might not be as cleanly separated as illustrated in FIG. 8. A read request may come in at any time, often while write operations are accumulating data and before a threshold of "D" bytes have been received.

Figure 9A:
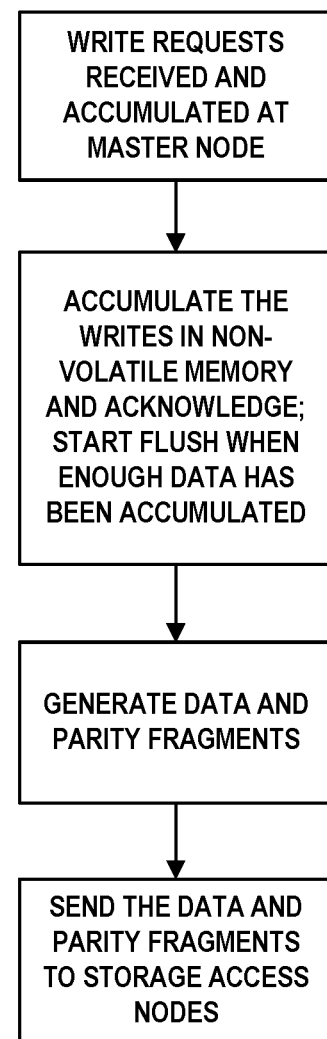
FIG. 9A and FIG. 9B are flow diagrams illustrating operations performed by an example master node, in accordance with one or more aspects of the present disclosure.
Figure 9B:
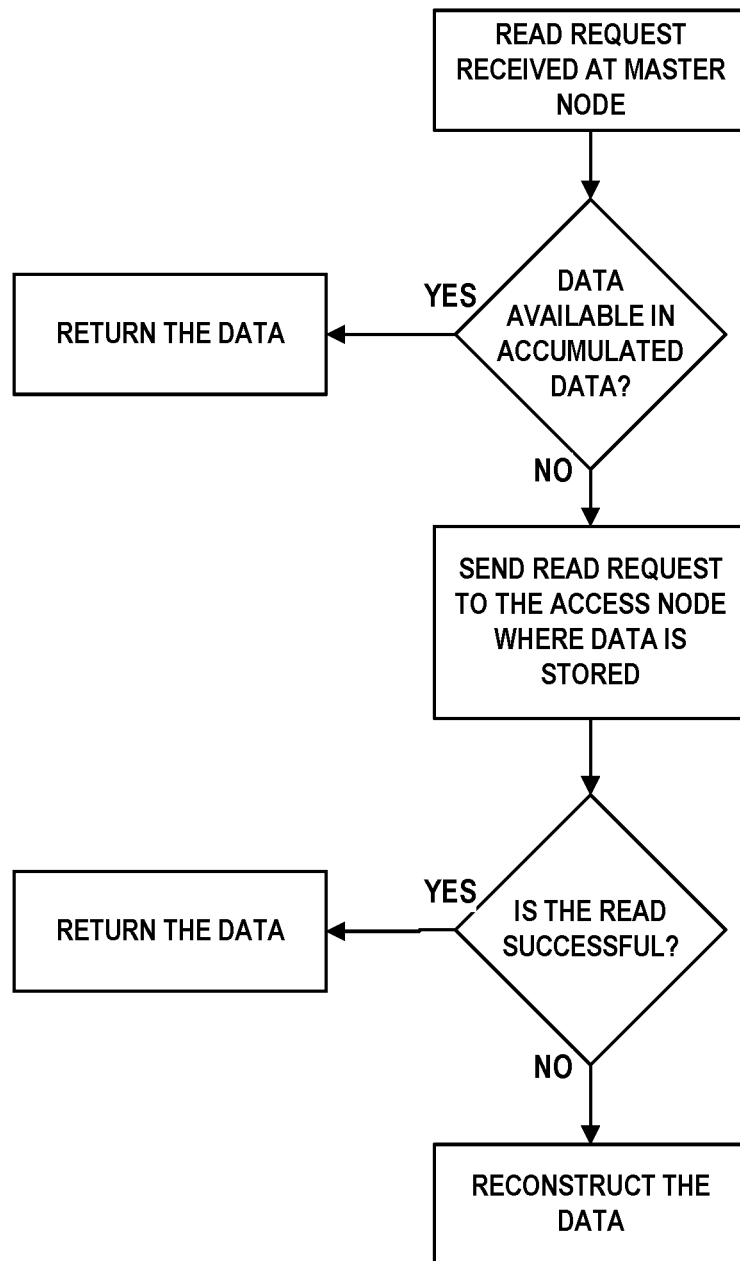

FIG. 9A and FIG. 9B are flow diagrams illustrating operations performed by an example master node, in accordance with one or more aspects of the present disclosure. The operations illustrated in FIG. 9A and FIG. 9B may more accurately represent operations performed by a master node in practice. FIG. 9A illustrates example read operations performed by a master node (e.g., node 417A in FIG. 4A). FIG. 9B illustrates example write operations performed by a master node.

Figure 10A:
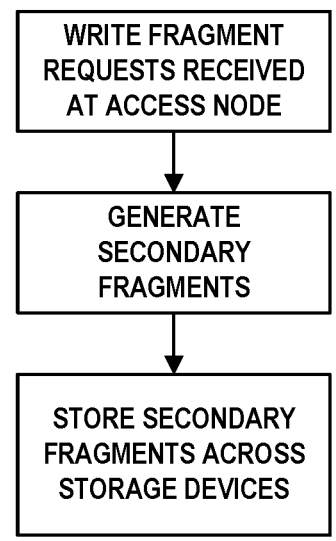
FIG. 10A and FIG. 10B are flow diagrams illustrating operations performed by an example storage node, in accordance with one or more aspects of the present disclosure
Figure 10B:
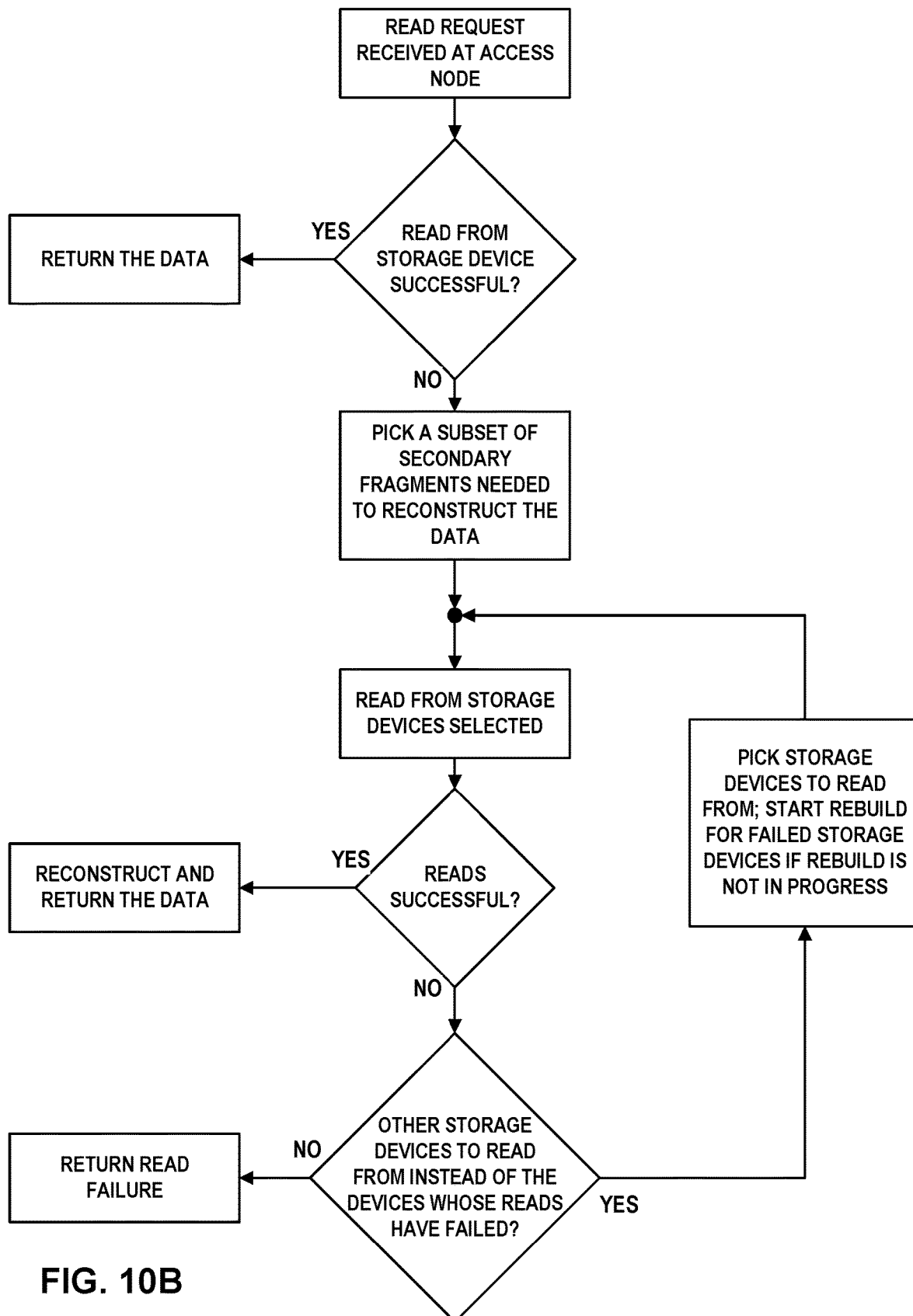

FIG. 10A and FIG. 10B are flow diagrams illustrating operations performed by an example storage node, in accordance with one or more aspects of the present disclosure. The operations illustrated in FIGS. 10A and 10B may more accurately represent operations performed by a storage node in practice. FIG. 10A illustrates example read operations performed by a storage node (e.g., nodes 17 of racks 70-2 and 70-3 of FIG. 1). FIG. 10B illustrates example write operations performed by a storage node. For processes, apparatuses, and other examples or illustrations described herein, including in any flowcharts or flow diagrams, certain operations, acts, steps, or events included in any of the techniques described herein can be performed in a different sequence, may be added, merged, or left out altogether (e.g., not all described acts or events are necessary for the practice of the techniques). Moreover, in certain examples, operations, acts, steps, or events may be performed concurrently, e.g., through multi-threaded processing, interrupt processing, or multiple processors, rather than sequentially. Further certain operations, acts, steps, or events may be performed automatically even if not specifically identified as being performed automatically. Also, certain operations, acts, steps, or events described as being performed automatically may be alternatively not performed automatically, but rather, such operations, acts, steps, or events may be, in some examples, performed in response to input or another event.

For ease of illustration, only a limited number of devices (e.g., data durability modules 406, as well as others) are shown within the Figures and/or in other illustrations referenced herein. However, techniques in accordance with one or more aspects of the present disclosure may be performed with many more of such systems, components, devices, modules, and/or other items, and collective references to such systems, components, devices, modules, and/or other items may represent any number of such systems, components, devices, modules, and/or other items.

The Figures included herein each illustrate at least one example implementation of an aspect of this disclosure. The scope of this disclosure is not, however, limited to such implementations. Accordingly, other example or alternative implementations of systems, methods or techniques described herein, beyond those illustrated in the Figures, may be appropriate in other instances. Such implementations may include a subset of the devices and/or components included in the Figures and/or may include additional devices and/or components not shown in the Figures.

The detailed description set forth above is intended as a description of various configurations and is not intended to represent the only configurations in which the concepts described herein may be practiced. The detailed description includes specific details for the purpose of providing a sufficient understanding of the various concepts. However, these concepts may be practiced without these specific details. In some instances, well-known structures and components are shown in block diagram form in the referenced figures in order to avoid obscuring such concepts.

Accordingly, although one or more implementations of various systems, devices, and/or components may be described with reference to specific Figures, such systems, devices, and/or components may be implemented in a number of different ways. For instance, one or more devices illustrated in the Figures herein (e.g., FIG. 1, FIG. 2, and/or FIG. 3) as separate devices may alternatively be implemented as a single device; one or more components illustrated as separate components may alternatively be implemented as a single component. Also, in some examples, one or more devices illustrated in the Figures herein as a single device may alternatively be implemented as multiple devices; one or more components illustrated as a single component may alternatively be implemented as multiple components. Each of such multiple devices and/or components may be directly coupled via wired or wireless communication and/or remotely coupled via one or more networks. Also, one or more devices or components that may be illustrated in various Figures herein may alternatively be implemented as part of another device or component not shown in such Figures. In this and other ways, some of the functions described herein may be performed via distributed processing by two or more devices or components.

Further, certain operations, techniques, features, and/or functions may be described herein as being performed by specific components, devices, and/or modules. In other examples, such operations, techniques, features, and/or functions may be performed by different components, devices, or modules. Accordingly, some operations, techniques, features, and/or functions that may be described herein as being attributed to one or more components, devices, or modules may, in other examples, be attributed to other components, devices, and/or modules, even if not specifically described herein in such a manner.

Although specific advantages have been identified in connection with descriptions of some examples, various other examples may include some, none, or all of the enumerated advantages. Other advantages, technical or otherwise, may become apparent to one of ordinary skill in the art from the present disclosure. Further, although specific examples have been disclosed herein, aspects of this disclosure may be implemented using any number of techniques, whether currently known or not, and accordingly, the present disclosure is not limited to the examples specifically described and/or illustrated in this disclosure.

In one or more examples, the functions described may be implemented in hardware, software, firmware, or any combination thereof. If implemented in software, the functions may be stored, as one or more instructions or code, on and/or transmitted over a computer-readable medium and executed by a hardware-based processing unit. Computer-readable media may include computer-readable storage media, which corresponds to a tangible medium such as data storage media, or communication media including any medium that facilitates transfer of a computer program from one place to another (e.g., pursuant to a communication protocol). In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can include RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the terms "processor" or "processing circuitry" as used herein may each refer to any of the foregoing structure or any other structure suitable for implementation of the techniques described. In addition, in some examples, the functionality described may be provided within dedicated hardware and/or software modules. Also, the techniques could be fully implemented in one or more circuits or logic elements.

The techniques of this disclosure may be implemented in a wide variety of devices or apparatuses, including a wireless handset, a mobile or non-mobile computing device, a wearable or non-wearable computing device, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperating hardware units, including one or more processors as described above, in conjunction with suitable software and/or firmware.

What is claimed is:

1. A system comprising a storage device and processing circuitry, wherein the processing circuitry has access to the storage device and is configured to:
    generate a plurality of data fragments from data to enable reconstruction of a portion of the data from a subset of the plurality of data fragments, wherein the plurality of data fragments includes a first fragment and a second fragment;
    store, across a plurality of nodes in a network, the plurality of data fragments, wherein storing the plurality of data fragments includes storing the first fragment at a first node and the second fragment at a second node;
    generate, by the first node, a plurality of secondary fragments derived from the first fragment to enable reconstruction of the first fragment from a subset of the plurality of secondary fragments;
    store the plurality of secondary fragments from the first fragment across a plurality of storage devices included within the first node, wherein storing the plurality of secondary fragments includes storing each of the plurality of secondary fragments in a different one of the plurality of storage devices; and
    reconstruct the portion of the data from a subset of the plurality of data fragments, wherein to reconstruct the portion of the data, the processing circuitry reduces network traffic by reconstructing the first fragment from a subset of the plurality of secondary fragments and avoiding the use of the plurality of data fragments stored across the plurality of nodes in the network.

2. The system of claim 1, wherein to reconstruct the portion of the data, the processing circuitry is further configured to:
    identify a failed storage device within the first node, wherein the failed storage device is one of the plurality of storage devices included within the first node; and
    reconstruct data stored at the failed storage device using secondary fragments stored across a reconstruction subset of the plurality of storage devices, wherein the reconstruction subset does not include the failed storage device.

3. The system of claim 2, wherein to reconstruct the data stored at the failed storage device, the processing circuitry is further configured to:
    reconstruct the data stored at the failed storage device within the first node without requiring network access to any of the other plurality of nodes in the network.

4. The system of claim 2, wherein to reconstruct the data stored at the failed storage device, the processing circuitry is further configured to:
reconstruct the data stored at the failed storage device within the first node without generating network activity.

5. The system of claim 1, wherein to generate a plurality of data fragments from the data, the processing circuitry is further configured to:
accumulate data from one or more servers; and
responsive to the data reaching a sufficient size, generate the plurality of data fragments from the data.

6. The system of claim 1, wherein the plurality of storage devices is a first plurality of storage devices, and wherein the processing circuitry is further configured to:
generate, by the second node, a plurality of secondary fragments derived from the second fragment to enable reconstruction of the second fragment from a subset of the plurality of secondary fragments derived from the second fragment; and
store the plurality of secondary fragments derived from the second fragment across a second plurality of storage devices included within the second node, wherein storing the plurality of secondary fragments derived from the second fragment includes storing each of the plurality of secondary fragments derived from the second fragment in a different one of the second plurality of storage devices.

7. The system of claim 6, wherein to reconstruct the portion of the data, the processing circuitry is further configured to:
reconstruct the second fragment from a subset of the plurality of second fragments derived from the second fragment.

8. The system of claim 1, wherein to generate the plurality of data fragments, the processing circuitry is further configured to:
generate a plurality of Reed Solomon erasure coding data fragments, the plurality of Reed Solomon erasure coding data fragments including a plurality of parity data fragments.

9. The system of claim 1, wherein to generate the plurality of secondary fragments from the first fragment, the processing circuitry is further configured to:
generate one or more parity data fragments.

10. The system of claim 1, wherein to store the plurality of data fragments, the processing circuitry is further configured to:
store each of the plurality of data fragments in a different fault domain.

11. The system of claim 10, wherein the fault domain is defined as a node.

12. The system of claim 10, wherein the fault domain is defined as a rack.

13. A method comprising:
generating, by a storage system, a plurality of data fragments from data to enable reconstruction of the data from a subset of the plurality of data fragments, wherein the plurality of data fragments includes a first fragment and a second fragment;
storing, by the storage system and across the plurality of nodes in a network, the plurality of data fragments, wherein storing the plurality of data fragments includes storing the first fragment at a first node and the second fragment at a second node, wherein the first node and the second node are included within the plurality of nodes;
generating, by the storage system, a plurality of secondary fragments derived from the first fragment to enable reconstruction of the first fragment from a subset of the plurality of secondary fragments;
storing, by the storage system, the plurality of secondary fragments from the first fragment across a plurality of storage devices included within the first node, wherein storing the plurality of secondary fragments includes storing each of the plurality of secondary fragments in a different one of the plurality of storage devices; and
reconstructing, by the storage system, the portion of the data from a subset of the plurality of data fragments, wherein reconstructing the portion of the data includes reducing network traffic by reconstructing the first fragment from a subset of the plurality of secondary fragments and avoiding the use of the plurality of data fragments stored across the plurality of nodes in the network.

14. The method of claim 13, wherein reconstructing the portion of the data includes:
identifying a failed storage device within the first node, wherein the failed storage device is one of the plurality of storage devices included within the first node; and
reconstructing data stored at the failed storage device using secondary fragments stored across a reconstruction subset of the plurality of storage devices, wherein the reconstruction subset does not include the failed storage device.

15. The method of claim 14, wherein reconstructing the data stored at the failed storage device includes:
reconstructing the data stored at the failed storage device within the first node without generating network activity.

16. The method of claim 14, wherein reconstructing the data stored at the failed storage device includes:
reconstructing the data stored at the failed storage device within the first node without requiring network access to any of the other plurality of nodes in the network.

17. The method of claim 13, wherein generating a plurality of data fragments from data includes:
accumulating data from one or more devices; and
responsive to the data reaching a sufficient size, generating the plurality of data fragments from the data.

18. The method of claim 13, wherein the plurality of storage devices is a first plurality of storage devices, the method further comprising:
generating, by the second node, a plurality of secondary fragments derived from the second fragment to enable reconstruction of the second fragment from a subset of the plurality of secondary fragments derived from the second fragment; and
storing the plurality of secondary fragments derived from the second fragment across a second plurality of storage devices included within the second node, wherein storing the plurality of secondary fragments derived from the second fragment includes storing each of the plurality of secondary fragments derived from the second fragment in a different one of the second plurality of storage devices.

19. The method of claim 18, wherein reconstructing data includes:
reconstructing the second fragment from a subset of the plurality of second fragments derived from the second fragment.

20. A non-transitory computer-readable storage medium comprising instructions that, when executed, configure processing circuitry of a storage system to perform operations comprising:
- generating a plurality of data fragments from data to enable reconstruction of at least a portion of the data from a subset of the plurality of data fragments, wherein the plurality of data fragments includes a first fragment and a second fragment;
- storing, across a plurality of nodes in a network, the plurality of data fragments, wherein storing the plurality of data fragments includes storing the first fragment at a first node and the second fragment at a second node;
- generating, by the first node, a plurality of secondary fragments derived from the first fragment to enable reconstruction of the first fragment from a subset of the plurality of secondary fragments;
- storing the plurality of secondary fragments from the first fragment across a plurality of storage devices included within the first node, wherein storing the plurality of secondary fragments includes storing each of the plurality of secondary fragments in a different one of the plurality of storage devices; and
- reconstructing the portion of the data from a subset of the plurality of data fragments, wherein reconstructing the portion of the data includes reducing network traffic by reconstructing the first fragment from a subset of the plurality of secondary fragments and avoiding the use of the plurality of data fragments stored across the plurality of nodes in the network.

* * * * *